US012527144B2

(12) United States Patent
Bian et al.

(10) Patent No.: US 12,527,144 B2
(45) Date of Patent: Jan. 13, 2026

(54) ARRAY SUBSTRATE, DISPLAY PANEL, DRIVING METHOD FOR DISPLAY PANEL, AND DISPLAY APPARATUS

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Ruomei Bian, Beijing (CN); Honggui Jin, Beijing (CN); Hongsheng Bi, Beijing (CN); Yang Liu, Beijing (CN); Zhilong Duan, Beijing (CN); Peipei Wang, Beijing (CN); Pingyuan Sun, Beijing (CN); Jian Wang, Beijing (CN); Yong Zhang, Beijing (CN); Yue Yang, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/992,304

(22) PCT Filed: May 17, 2023

(86) PCT No.: PCT/CN2023/094814
§ 371 (c)(1),
(2) Date: Jan. 8, 2025

(87) PCT Pub. No.: WO2024/234337
PCT Pub. Date: Nov. 21, 2024

(65) Prior Publication Data

US 2025/0261492 A1 Aug. 14, 2025

(51) Int. Cl.
*G09G 3/32* (2016.01)
*G11C 19/28* (2006.01)
*H10H 29/49* (2025.01)

(52) U.S. Cl.
CPC ............... *H10H 29/49* (2025.01); *G09G 3/32* (2013.01); *G11C 19/28* (2013.01);
(Continued)

(58) Field of Classification Search
CPC .................... H10H 29/49; G09G 3/32; G09G 2300/0426; G09G 2310/0267;
(Continued)

(56) References Cited

U.S. PATENT DOCUMENTS 11,199,921 B2 * 12/2021 Zhang .................. G09G 3/3677
2018/0188858 A1 * 7/2018 Zhang ..................... G06F 3/047
(Continued)

FOREIGN PATENT DOCUMENTS

CN 103514846 A 1/2014
CN 104950538 A 9/2015
(Continued)

*Primary Examiner* — Pegeman Karimi
(74) *Attorney, Agent, or Firm* — The Webb Law Firm

(57) ABSTRACT

An array substrate includes sub-pixels, gate lines and data lines. The sub-pixels form pixel groups each including the first and second sub-pixels. The first sub-pixel includes a first transistor and a first electrode group including a first pixel electrode and a first common electrode. The second sub-pixel includes a second transistor and a second electrode group including a second pixel electrode and a second common electrode. The gate lines form gate line groups each including a first gate line and a second gate line. At least part of the data lines each include: first data segments between a i-th column of sub-pixels and a (i+1)-th column of sub-pixels, second data segments between a (i−j)-th column of sub-pixels and a (i−j−1)-th column of sub-pixels, and third
(Continued)

segments. An overlapping area of the first pixel electrode and first common electrode equals that of the second pixel electrode and second common electrode.

20 Claims, 25 Drawing Sheets

(52) U.S. Cl.
CPC ............... *G09G 2300/0426* (2013.01); *G09G 2310/0267* (2013.01); *G09G 2310/0286* (2013.01); *G09G 2310/08* (2013.01); *G09G 2320/0247* (2013.01)

(58) Field of Classification Search
CPC ....... G09G 2310/0286; G09G 2310/08; G09G 2320/0247; G09G 3/3677; G11C 19/28; G02F 1/1362
See application file for complete search history.

(56) References Cited

U.S. PATENT DOCUMENTS

| | | | | |
|---|---|---|---|---|
| 2018/0341354 | A1 * | 11/2018 | Guo | G06F 3/0443 |
| 2022/0129097 | A1 * | 4/2022 | Chen | G06F 3/0412 |
| 2022/0139961 | A1 | 5/2022 | Mu et al. | |

FOREIGN PATENT DOCUMENTS

| | | | |
|---|---|---|---|
| CN | 209357444 | U | 9/2019 |
| CN | 110308600 | A | 10/2019 |
| CN | 113325638 | A | 8/2021 |
| CN | 113823212 | A | 12/2021 |
| CN | 114415431 | A | 4/2022 |
| CN | 114664224 | A | 6/2022 |
| KR | 1020070096422 | A | 10/2007 |
| WO | 2021196089 | A1 | 10/2021 |

* cited by examiner

ARRAY SUBSTRATE, DISPLAY PANEL, DRIVING METHOD FOR DISPLAY PANEL, AND DISPLAY APPARATUS

CROSS-REFERENCE TO RELATED APPLICATION

This application is the United States national phase of International Patent Application No. PCT/CN2023/094814 filed May 17, 2023, the disclosure of which is hereby incorporated by reference in its entirety.

BACKGROUND OF THE INVENTION

Field of the Invention

The present disclosure relates to the field of display technologies, and in particular, to an array substrate, a display panel and a driving method for the display panel, and a display apparatus.

Description of Related Art

In the field of display technologies, display panels and display apparatuses are usually driven using thin film transistors. With the development of display technologies, pixel arrays are usually driven by a dual-gate line driving method to reduce costs. The dual-gate line driving method can make the number of data lines halve compared to the number of data lines in the traditional driving method, thereby reducing the number of source driving circuits, which in turn reduces the number of driving chips and reduces the cost.

SUMMARY OF THE INVENTION

In an aspect, an array substrate is provided. The array substrate includes a base substrate, and a plurality of sub-pixels, a plurality of gate lines and a plurality of data lines that are disposed on the base substrate. The plurality of sub-pixels arranged in an array, and the plurality of sub-pixels are arranged in E rows and F columns. The plurality of sub-pixels form a plurality of pixel groups, each pixel group includes a first sub-pixel and a second sub-pixel, the first sub-pixel includes a first transistor and a first electrode group, and the second sub-pixel includes a second transistor and a second electrode group; the first electrode group and the second electrode group are arranged sequentially along a row direction; the first transistor and the second transistor are both located between the first electrode group and the second electrode group, and are respectively located on both ends of the pixel group along a column direction; and the first electrode group includes a first pixel electrode and a first common electrode, and the second electrode group includes a second pixel electrode and a second common electrode. The plurality of gate lines form a plurality of gate line groups, where each gate line group includes a first gate line and a second gate line, and the first sub-pixel and the second sub-pixel of each pixel group are respectively connected to a first gate line and a second gate line of one gate line group. The plurality of data lines are disposed on the base substrate, where the first sub-pixel and the second sub-pixel of each pixel group are connected to one of the data lines; at least part of the plurality of data lines each include third data segments extending along the row direction, first data segments and second data segments extending along the column direction, a third data segment being connected between a first data segment and a second data segment; and the first data segments are disposed between an i-th column of sub-pixels and a (i+1)-th column of sub-pixels, and the second data segments are disposed between a (i−j)-th column of sub-pixels and a (i−j−1)-th column of sub-pixels, and j is greater than or equal to 1; and i+1≤F. An overlapping area of the first pixel electrode and the first common electrode is equal to an overlapping area of the second pixel electrode and the second common electrode.

In some embodiments, j=1; and two data lines located outermost in the row direction are a first data line and a second data line, where first data segments of the first data line are disposed between a first column of sub-pixels and a second column of sub-pixels, and second data segments of the first data line are disposed on a side of the first column of sub-pixels away from multiple columns of sub-pixels other than the first column of sub-pixels in the F columns; and first data segments of the second data line are disposed on a side of an F-th column of sub-pixels away from multiple columns of sub-pixels other than the F-th column of sub-pixels in the F columns, and second data segments of the second data line are disposed between a (F−1)-th column of sub-pixels and the F-th column of sub-pixels.

In some embodiments, at least a portion of the data line connected to the pixel group is located between the first electrode group and the second electrode group of the pixel group, and the at least a portion of the data line is a first data segment or a second data segment; a first electrode of the first transistor and a first electrode of the second transistor are both connected to the data line, a second electrode of the first transistor is connected to the first pixel electrode, and a second electrode of the second transistor is connected to the second pixel electrode; and a direction that is from the first electrode to the second electrode of the first transistor and parallel to the row direction is a first direction, and a direction that is from the first electrode to the second electrode of the second transistor and parallel to the row direction is a second direction, the first direction being opposite to the second direction.

In some embodiments, the first transistor and the second transistor each include a gate electrode, an active layer, and source-drain electrodes that are stacked in sequence, and the source-drain electrodes include the first electrode and the second electrode; and an orthographic projection of the active layer on the base substrate lies within an orthographic projection of the gate electrode on the base substrate, and at least a portion of an orthographic projection of each of the first electrode and the second electrode on the base substrate lies within the orthographic projection of the active layer on the base substrate; and an orthographic projection of the first electrode is U-shaped, and an opening of the first electrode faces the second electrode.

In some embodiments, the first pixel electrode and the second pixel electrode are block electrodes, the first common electrode and the second common electrode are strip electrodes, and the first common electrode and the second common electrode each include a plurality of slits; an aperture ratio of the first sub-pixel is equal to an aperture ratio of the second sub-pixel; and the first electrode group has a first domain region and a second domain region arranged along the column direction, and the second electrode group has a third domain region and a fourth domain region arranged along the column direction; and the first domain region, the second domain region, the third domain region, and the fourth domain region have a same aperture ratio.

In some embodiments, the array substrate further includes: first spacers, a first spacer being disposed on a side of the first transistor away from the base substrate, and second spacers, a second spacer being disposed on a side of the second transistor away from the base substrate, where a center of an orthographic projection of the first spacer on the base substrate is offset a first distance in a third direction relative to a center of an orthographic projection of the first transistor on the base substrate, the third direction being a direction in which the first transistor points to the second transistor; and a center of an orthographic projection of the second spacer on the base substrate is offset a second distance in a fourth direction relative to a center of an orthographic projection of the second transistor on the base substrate, the fourth direction being a direction in which the second transistor points to the first transistor.

In some embodiments, the first distance is equal to the second distance.

In some embodiments, the orthographic projection of the first spacer on the base substrate has an overlap with the orthographic projections of the first pixel electrode and the second pixel electrode on the base substrate; and the orthographic projection of the second spacer on the base substrate has an overlap with the orthographic projections of the first pixel electrode and the second pixel electrode on the base substrate.

In another aspect, a display panel is provided, having a display area and a peripheral area. The display panel includes the array substrate according to any one of the above embodiments, where the plurality of pixel groups are located in the display area; and at least one gate driving circuit disposed on the base substrate and located in the peripheral area, where a gate driving circuit includes N shift registers cascaded. An output terminal of a shift register at an i-th stage is connected to an input terminal of a shift register at a (i+n)-th stage, and an output terminal of a shift register at a (i+n+2j)-th stage is connected to a reset terminal of the shift register at the i-th stage; and j is greater than or equal to 1; the plurality of gate lines are arranged sequentially along the column direction, and a plurality of first gate lines in the plurality of gate lines and a plurality of second gate lines in the plurality of gate lines are alternately arranged; and in the N shift registers cascaded, each shift register is electrically connected to a gate line.

In some embodiments, the N shift registers are arranged in the column direction. The display panel further includes: a first voltage signal line disposed on a side of the gate driving circuit along the row direction, an auxiliary first voltage signal line located on an opposite side of the gate driving circuit, and first lead-out lines, where a shift register at each stage includes a plurality of transistors, and at least one of the plurality of transistors is electrically connected to the first voltage signal line; the plurality of transistors include a reset transistor, a plurality of noise reduction transistors and an input transistor, and the input transistor and the reset transistor are farther away from the first voltage signal line than the noise reduction transistors; the first voltage signal line is connected to the auxiliary first voltage signal line; and the input transistor and the reset transistor are closer to the auxiliary first voltage signal line than the noise reduction transistors; and reset transistors of at least part of the N shift registers are each connected to the auxiliary first voltage signal line through a first lead-out line.

In some embodiments, the display panel further includes: a connection voltage signal line disposed on a side of a shift register at a last stage of the gate driving circuit away from remaining shift registers, the first voltage signal line and the auxiliary first voltage signal line are connected through the connection voltage signal line, and the connection voltage signal line extends along the row direction; where the connection voltage signal line includes a plurality of signal sub-lines electrically connected to each other.

In some embodiments, the display panel further includes: second lead-out lines, the noise reduction transistors of the shift register at each stage are connected to the first voltage signal line through a second lead-out line.

In some embodiments, the plurality of noise reduction transistors form a plurality of groups of noise reduction transistors, each group of noise reduction transistors includes two noise reduction transistors, and the two noise reduction transistors of each group of noise reduction transistors are provided therebetween with a second lead-out line; and for at least one group of noise reduction transistors, two noise reduction transistors therein are disposed in a staggered manner in the column direction.

In some embodiments, in the column direction, a dimension of a region where the shift register at each stage is located is in a range of 60 μm to 100 μm.

In some embodiments, the display panel further includes M clock signal lines disposed on a side of the gate driving circuit away from the display area, the clock signal lines being electrically connected to the gate driving circuit, and an i-th clock signal line being connected to a shift register at a (Mm+i)-th stage, where $1 \le i \le M$, i is an integer, $0 \le m$, m is an integer, and $(Mm+i) \le N$.

In some embodiments, a starting position of a valid clock signal output by the i-th clock signal line is earlier than a starting position of a valid clock signal of a (i+1)-th clock signal line, $i+1 \le M$.

In some embodiments, starting from a first clock signal line, every two adjacent clock signal lines form a group; in each group of clock signal lines, a starting position of a valid clock signal transmitted by a 2nd clock signal line is earlier than a starting position of a valid clock signal transmitted by a 1st clock signal line; and a starting position of a valid clock signal output by the i-th clock signal line is earlier than a starting position of a valid clock signal output by a (i+2)-th clock signal line, $i+2 \le M$.

In yet another aspect, a driving method for a display panel is provided. The driving method for a display panel is applied to the display panel according to any one of the above embodiments. The plurality of pixel groups include multiple rows of pixel groups arranged along the column direction, and each row of pixel groups includes at least two pixel groups arranged along the row direction; each row of pixel groups is disposed between a first gate line and a second gate line of a gate line group and is electrically connected to the gate line group; and the driving method includes: in a case where the display panel is to display a first set image, outputting, by the gate driving circuit, a first set of gate driving signals, to activate the multiple rows of pixel groups row by row under scanning of the plurality of gate line groups, where in each row of pixel groups, first sub-pixels electrically connected to the first gate line are turned on before second sub-pixels electrically connected to the second gate line.

In some embodiments, the driving method further includes: in a case where the display panel is to display a second set image, outputting, by the gate driving circuit, a second set of gate driving signals, to activate the multiple rows of pixel groups row by row under scanning of the plurality of gate line groups, where in each row of pixel groups, the second sub-pixels electrically connected to the second gate line are turned on before the first sub-pixels electrically connected to the first gate line.

In still another aspect, a display apparatus is provided, including the display panel according to any one of the above embodiments.

In some embodiments, the display apparatus further includes M clock signal lines, an i-th clock signal line being connected to a shift register at a (Mm+i)-th stage, where 1≤i≤M, i is an integer, 0≤m, m is an integer, and (Mm+i)≤N. The display apparatus further includes a control chip, the control chip being connected to the M clock signal lines to output clock signals to the M clock signal lines. The control chip is configured to, when detecting that the display panel is to display a first set image, sequentially output valid clock signals to the M clock signal lines in a first order, where the first order is 1, 2, 3, 4, . . . , M−1, and M, and when detecting that the display panel is to display a second set image, sequentially output the valid clock signals to the M clock signal lines in a second order, where the second order is 2, 1, 4, 3, . . . , M, and M−1.

BRIEF DESCRIPTION OF THE DRAWINGS

In order to describe technical solutions in the present disclosure more clearly, the accompanying drawings to be used in some embodiments of the present disclosure will be introduced briefly, and it will be obvious that the accompanying drawings to be described below are merely drawings of some embodiments of the present disclosure, and a person of ordinary skill in the art can obtain other drawings according to those drawings. In addition, the accompanying drawings in the following description may be regarded as schematic diagrams, but are not limitations on actual sizes of products, actual processes of methods and actual timings of signals involved in the embodiments of the present disclosure.

DESCRIPTION OF THE INVENTION

Figure 1:
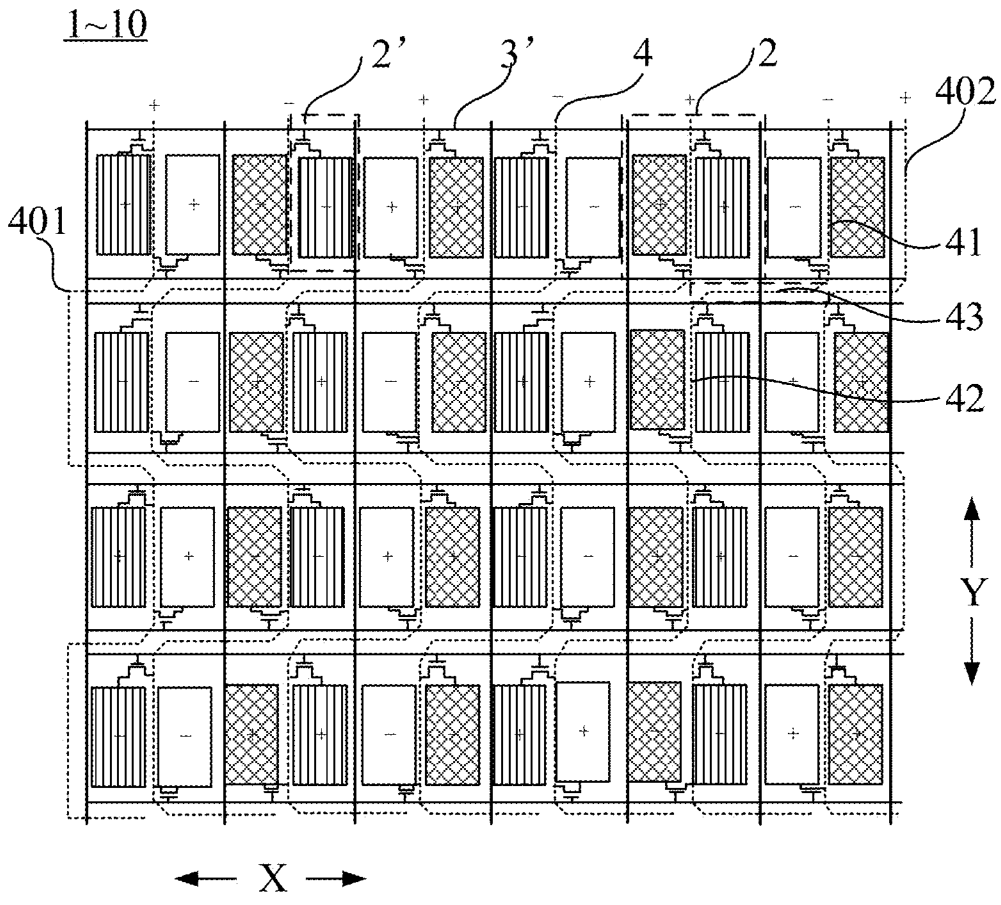
FIG. 1 is a structural diagram of an array substrate in accordance with some embodiments.

The technical solutions in embodiments of the present disclosure will be described clearly and completely with reference to the accompanying drawings, and it will be obvious that the described embodiments are merely some but not all of embodiments of the present disclosure. All other embodiments obtained on the basis of the embodiments of the present disclosure by a person of ordinary skill in the art shall be included in the protection scope of the present disclosure.

Unless the context requires otherwise, throughout the description and claims, the term "comprise" and other forms thereof such as the third-person singular form "comprises" and the present participle form "comprising" are construed as an open and inclusive meaning, i.e., "included, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, specific features, structures, materials, or characteristics described herein may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, the features defined with "first" and "second" may explicitly or implicitly include one or more of the features. In the description of the embodiments of the present disclosure, the term "a plurality of" or "multiple" means two or more unless otherwise specified.

Some embodiments may be described using the terms "coupled", "connected" and their derivatives. The term "connected" should be understood in a broad sense. For example, "connected" may indicate a fixed connection, a detachable connection, or an integrated connection; and it may indicate a direct connection or an indirect connection through an intermediate medium. The term "coupled" indicates, for example, that two or more components are in direct physical or electrical contact. However, the term "coupled" or "communicatively coupled" may also indicate that two or more components are not in direct contact with each other, but still cooperate or interact with each other. The embodiments disclosed herein are not necessarily limited to the context herein.

The phrase "at least one of A, B and C" has the same meaning as the phrase "at least one of A, B or C", both including the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "applicable to" or "configured to" used herein means an open and inclusive expression, which does not exclude devices that are applicable to or configured to perform additional tasks or steps.

The term such as "about", "substantially" or "approximately" as used herein includes a stated value and an average value within an acceptable range of deviation of a particular value determined by a person of ordinary skilled in the art, considering measurement in question and errors associated with measurement of a particular quantity (i.e., limitations of a measurement system).

The term such as "parallel", "perpendicular" or "equal" as used herein includes a stated case and a case similar to the stated case within an acceptable range of deviation determined by a person of ordinary skill in the art, considering measurement in question and errors associated with measurement of a particular quantity (i.e., limitations of a measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°; and the term "equal" includes absolute equality and approximate equality, and an acceptable range of deviation of the approximate equality may be, for example, that a difference between two equals is less than or equal to 5% of either of the two equals.

It will be understood that, when a layer or element is referred to as being on another layer or substrate, it may be that the layer or element is directly on the another layer or substrate, or it may be that intervening layer(s) exist between the layer or element and the another layer or substrate.

Exemplary embodiments are described herein with reference to sectional views and/or plan views as idealized exemplary drawings. In the accompanying drawings, thicknesses of layers and sizes of regions (areas) are enlarged for clarity. Variations in shape relative to the accompanying drawings due to, for example, manufacturing technologies and/or tolerances may be envisaged. Therefore, the exemplary embodiments should not be construed as being limited to the shapes of the regions shown herein, but including deviations due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

At present, low-cost display products usually use a dual-gate line driving method to drive pixel arrays. The dual-gate line driving method can reduce the number of channels of data lines, thereby reducing the number of driving chips to reduce costs. However, in existing display panels using the dual-gate line driving method, there are differences in the layout of different thin film transistors, which leads to differences in parasitic capacitance when different film layers have alignment deviations during the process, thus leading a poor display performance of the product, such as the appearance of vertical lines, flickering, afterimages, and other undesirable display phenomena.

In light of this, some embodiments of the present disclosure provide an array substrate, a display panel, a driving method for the display panel, and a display apparatus, to solve the problem of poor image display (such as flickering, afterimages, and vertical lines) while ensuring the uniformity of the light effect, and thus improve the yield and quality of the product.

The array substrate, the display panel, the driving method for the display panel, and the display apparatus provided by the present disclosure are described below, respectively.

Figure 2A:
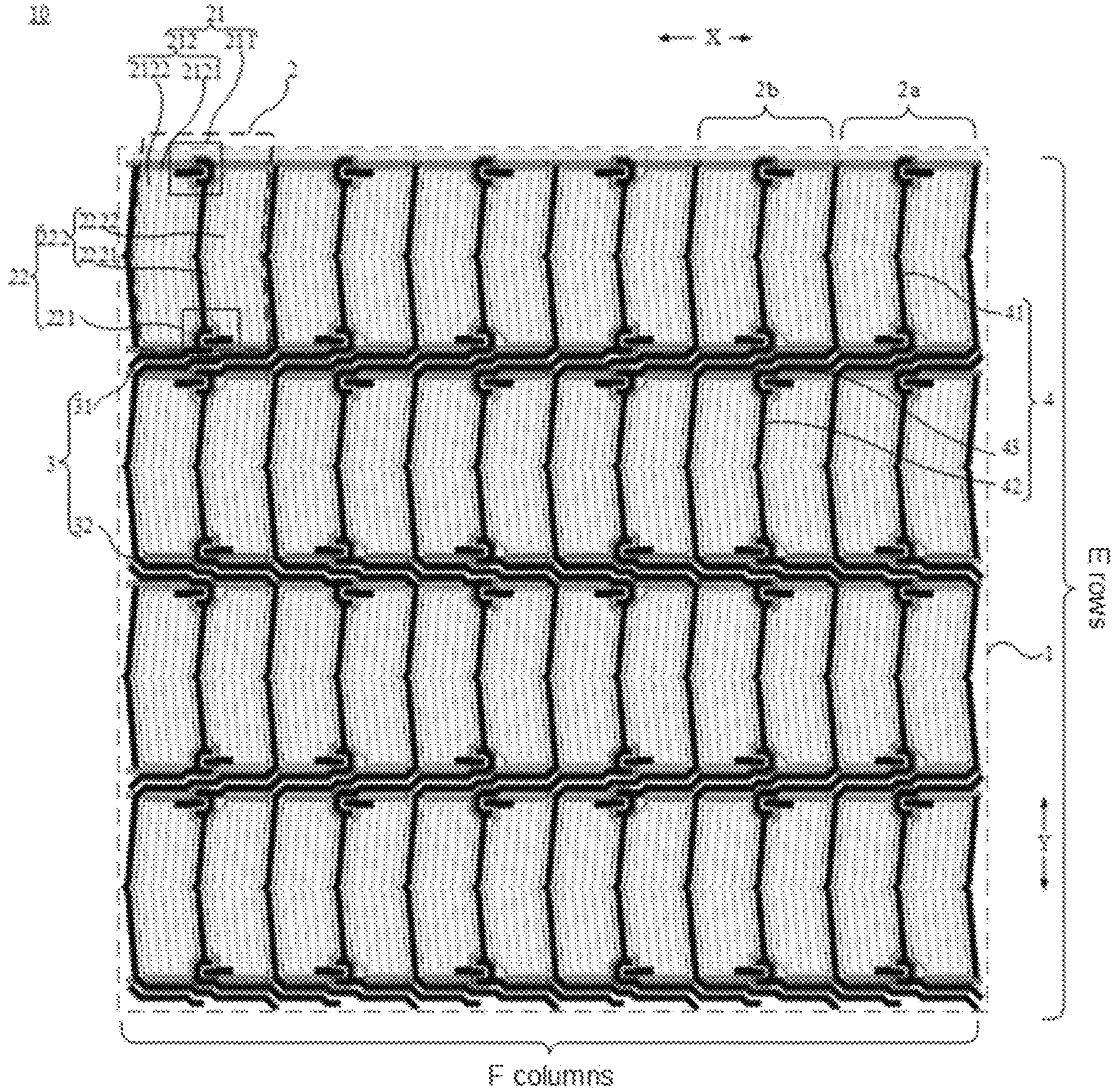
FIG. 2A is another structural diagram of an array substrate in accordance with some embodiments.

Some embodiments of the present disclosure provide an array substrate 10. As shown in FIG. 1 and FIG. 2A, the array substrate 10 includes a base substrate 1, and a plurality of sub-pixels 2', a plurality of gate line 3' and a plurality of data lines 4 that are disposed on the base substrate 1. The plurality of sub-pixels 2' are arranged in an array with E rows and F columns on the base substrate 1, and the plurality of sub-pixels 2' form a plurality of pixel groups 2.

Figure 4:
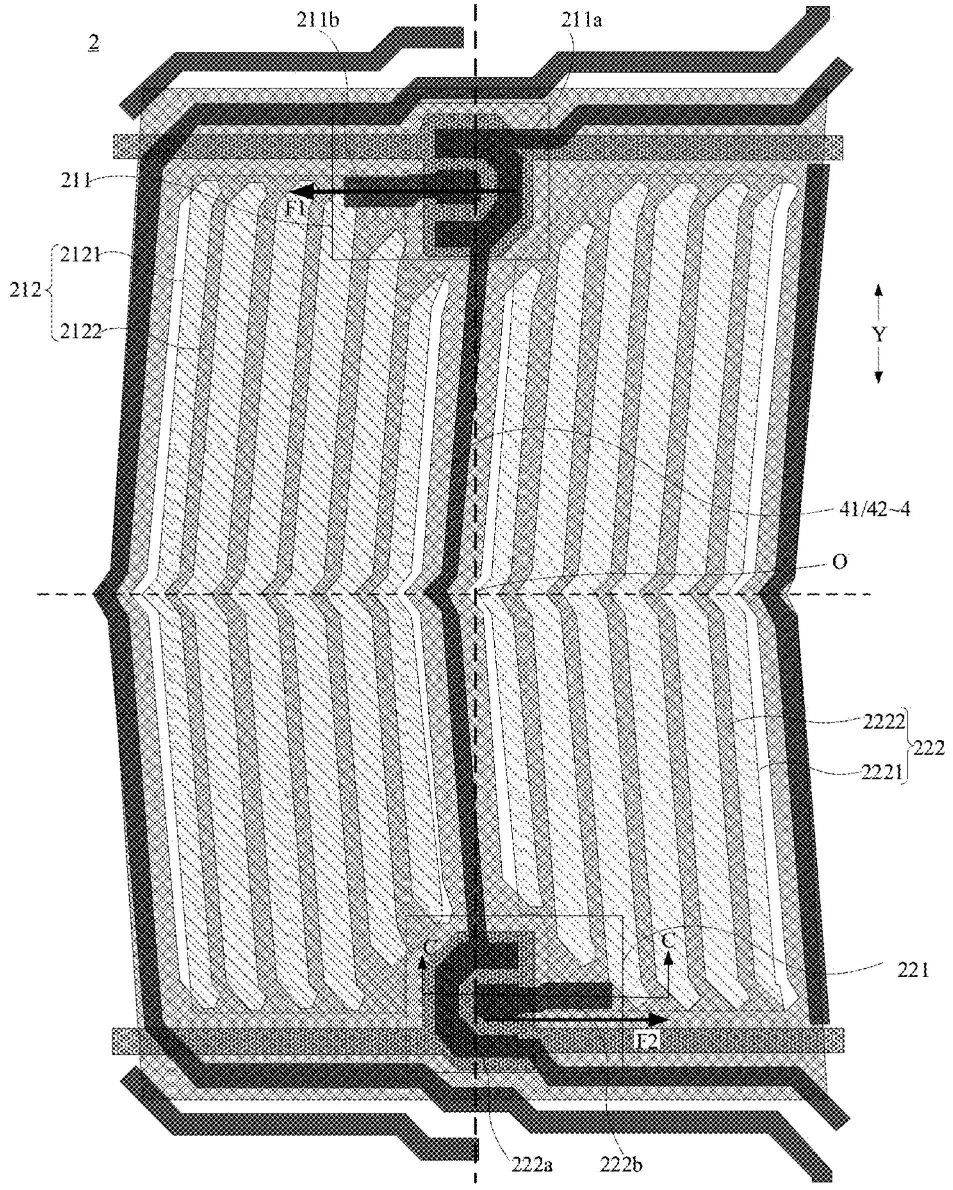
FIG. 4 is a structural diagram of a pixel group of an array substrate in accordance with some embodiments.

Referring to FIG. 2A and FIG. 4, the plurality of sub-pixels 2' are divided into the plurality of pixel groups 2. Each pixel group 2 includes two adjacent sub-pixels 2', in which the two sub-pixels 2' are arranged along a row direction X. Each sub-pixel 2' includes a transistor and an electrode group, where the electrode group consists of a pixel electrode and a common electrode that are arranged in an overlapping manner. Each pixel group 2 includes a first sub-pixel 21 and a second sub-pixel 22, in which the first sub-pixel 21 includes a first transistor 211 and a first electrode group 212, and the second sub-pixel 22 includes a second transistor 221 and a second electrode group 222. The first electrode group 212 and the second electrode group 222 are arranged sequentially along the row direction X. The first transistor 211 and the second transistor 221 are both located between the first electrode group 212 and the second electrode group 222, and are respectively located on both ends of the pixel group 2 along a column direction Y. The first electrode group 212 includes a first pixel electrode 2121 and a first common electrode 2122, and the second electrode group 222 includes a second pixel electrode 2221 and a second common electrode 2222.

The plurality of gate lines 3' form a plurality of gate line groups 3, where each gate line group 3 of the plurality of gate line groups 3 includes a first gate line 31 and a second gate line 32. The first sub-pixel 21 and the second sub-pixel 22 of each pixel group 2 are respectively connected to a first gate line 31 and a second gate line 32 of one gate line group, that is, a gate electrode of the first transistor 211 included in the first sub-pixel 21 is electrically connected to the first gate line 31, and a gate electrode of the second transistor 221 included in the second sub-pixel 22 is electrically connected to the second gate line 32.

For example, the plurality of gate lines 3' each extend along the row direction X and are arranged along the column direction Y. Every two adjacent gate lines 3' form one gate line group 3, and the gate line group 3 is electrically connected to a row of sub-pixels 2'. Two gate lines 31, 32 in each gate line group 3 are located on both sides of a row of sub-pixels 2', in which the first gate line 31 is electrically connected to first sub-pixels 21 of all pixel groups 2 in the row of sub-pixels 2', and the second gate line 32 is electrically connected to second sub-pixels of all pixel groups 2 in the row of sub-pixels 2'.

It will be noted that in each pixel group 2, the relative position of the first sub-pixel 21 and the second sub-pixel 22 is not fixed. Considering an example in which for a row of sub-pixels 2' and a gate line group 3 corresponding thereto, sub-pixels electrically connected to a first gate line 31 are all first sub-pixels 21, and sub-pixels electrically connected to a second gate line 32 are all second sub-pixels 22, as shown in FIG. 2A, in a pixel group 2 in the upper left corner, a first sub-pixel 21 therein is located on the left side of a second sub-pixel 22 therein, where the first sub-pixel 21 is an odd-numbered sub-pixel of this row of sub-pixels, and a pixel group 2 in the upper right corner, a first sub-pixel 21 is located on the right side of a second sub-pixel 22 therein, where the first sub-pixel 21 is an even-numbered sub-pixel of this row of sub-pixels.

As shown in FIG. 1, the first sub-pixel 21 and the second sub-pixel 22 of each pixel group 2 are both connected to a data line 4, that is, the two sub-pixels in the pixel group 2 are controlled by the same data line. The plurality of data lines 4 are arranged along the row direction X. At least part of the plurality of data lines 4 each include third data segments 43 extending along the row direction X, and first data segments 41 and second data segments 42 extending along the column direction Y, where a third data segment 43 is connected between a first data segment 41 and a second data segment 42. The first data segments 41 are disposed between an i-th column of sub-pixels and a (i+1)-th column of sub-pixels, and the second data segments 42 are disposed between a (i−j)-th column of sub-pixels and a (i−j−1)-th column of sub-pixels, where j is greater than or equal to 1, and i+1≤F.

It will be noted that the at least part of the data lines here refer to the remaining data lines except the two data lines located outermost along the row direction X.

For example, referring to FIG. 1, an arrangement of at least part of the data lines 4 is illustrated in a case where j is equal to 1. The at least part of the data lines 4 each include third data segments 43 extending along the row direction X, and first data segments 41 and second data segments 42 extending along the column direction Y. As can be seen in FIG. 1, the first data segments 41 are disposed between an i-th column of sub-pixels and a (i+1)-th column of sub-pixels, and the first data segments 41 are electrically connected to sub-pixels on both sides thereof; and the second data segments 42 are disposed between a (i−1)-th column of sub-pixels and a (i−2)-th column of sub-pixels, and the second data segments 42 are electrically connected to sub-pixels on both sides thereof. That is to say, first data segments 41 and second data segments 42 of a same data line 4 are separated by two columns of sub-pixels. The arrangement of the data lines 4 shown in FIG. 1 is only an example, that is, the arrangement of the data lines corresponding to a case where j is equal to 1; and in a case where j is greater than 1, the first data segments 41 and the second data segments 42 of the same data line 4 are separated by three columns of sub-pixels, four columns of sub-pixels, or the like.

It can be understood that in the above arrangement, a same data line 4 is capable of being electrically connected to two adjacent columns of pixel groups 2, in which each first data segment 41 of the data line is electrically connected to each odd-numbered pixel group 2 (or each even-numbered pixel group 2) of one column of pixel groups, and each second data segment 42 of the data line 4 is electrically connected to each even-numbered pixel group 2 (or each odd-numbered pixel group 2) of the other column of pixel groups.

In some embodiments, continue to refer to FIG. 1, j=1; and two data lines 4 located outermost in the row direction X are a first data line 401 and a second data line 402. First data segments 41 of the first data line 401 are disposed between a first column of sub-pixels and a second column of sub-pixels, and second data segments 42 of the first data line 401 are disposed on a side of the first column of sub-pixels away from multiple columns of sub-pixels; and first data segments 41 of the second data line 402 are disposed on a side of an F-th column of sub-pixels away from multiple columns of sub-pixels, and second data segments 42 of the second data line 402 are disposed between a (F−1)-th column of sub-pixels and the F-th column of sub-pixels.

For example, as shown in FIG. 1, the columns of sub-pixels arranged sequentially from left to right in FIG. 1 are the first column of sub-pixels, the second column of sub-pixels, . . . , the F-th column of sub-pixels, where the first data line 401 and the second data line 402 are respectively located on the leftmost side and the rightmost side of the plurality of data lines 4. The second data segments 42 of the first data line 401 are disposed on a side of the first column of sub-pixels away from multiple columns of sub-pixels, that is, the second data segments 42 are located on the left side of the first column of sub-pixels; and the first data segments 41 of the second data line 402 are disposed on a side of the F-th column of sub-pixels away from multiple columns of sub-pixels, that is, the first data segments 41 are located on the right side of the F-th column of sub-pixels.

For example, the base substrate 1 has a supporting and protective function. The base substrate 1 may be a rigid substrate, such as a glass substrate or a silicon substrate, or may be a flexible substrate, such as a polyimide substrate, which is not limited here.

In some embodiments, referring to FIG. 2A, the plurality of pixel groups 2 are arranged in multiple rows and multiple columns, where each row of pixel groups 2 is disposed between a first gate line 31 and a second gate line 32 of one gate line group 3. The plurality of data lines 4 are arranged along the row direction. Each data line 4 includes a plurality of first data segments 41 and a plurality of second data segments 42 that are alternately arranged. Except for the two data lines 4 located outermost in the row direction, a plurality of first data segments 41 of a data line 4 are each located between a first electrode group 212 and a second electrode group 222 of a pixel group in an odd-numbered row in a 1st column of pixel groups, and a plurality of second data segments 42 of a data line 4 are each located between a first electrode group 212 and a second electrode group 222 of a pixel group in an even-numbered row in a 2nd column of pixel groups, where the 1st column of pixel groups and the 2nd column of pixel groups are adjacent to each other. The data line 4 further includes a plurality of third data segments 43, in which a third data segment 43 is connected between a first data segment 41 and a second data segment 42 adjacent thereto.

For example, referring to FIG. 2A, the plurality of pixel groups 2 shown in the figure are arranged in four rows and six columns, in which each row of pixel groups 2 is disposed between a first gate line 31 and a second gate line 32 of one gate line group 3. That is, in a same row of pixel groups 2, a first sub-pixel 21 and a second sub-pixel 22 included in each pixel group 2 are both electrically connected to a same gate line group 3. The plurality of data lines 4 are along the row direction X. The plurality of data lines 4 each include a plurality of first data segments 41 and a plurality of second data segments 42 extending along the column direction Y, in which the first data segments 41 are located between first electrode groups 212 and second electrode groups 222 of odd-numbered rows of pixel groups in a 1st column 2*a* of pixel groups, and the second data segments 42 are located between first electrode groups 212 and second electrode groups 222 of even-numbered rows of pixel groups in a 2nd column 2*b* of pixel groups. It will be noted that the 1st column of pixel groups and the 2nd column of pixel groups here are adjacent to each other, without a limitation on their specific positional relationship. The plurality of pixel groups 2 shown in FIG. 2A are only an example, in which the 1st column of pixel groups is located on the right side of the 2nd column of pixel groups, and the two are adjacent to each other. Third data segments 43 of the plurality of data lines 4 extend along the row direction X, each of which is connected between a first data segment 41 and a second data segment 42. It can be seen from the above that each data line 4 is presented in a shape of square wavy, i.e., a shape of the Chinese character "弓".

As shown in FIG. 1, using the above-mentioned "dual-gate line+square wavy-shaped pixel architecture", all sub-pixels in each row of sub-pixels are electrically connected to two gate lines in an odd-even alternating manner. The plurality of data lines 4 are each in a shape of square wavy, in which first data segments 41 of each data line 4 are located between two adjacent columns of sub-pixels, and second data segments 42 of each data line 4 are located between another two adjacent columns of sub-pixels. This arrangement reduces the number of the data lines 4 and the number of source driving channels for transmitting data signals. Moreover, owning to the square wavy-shaped data line design, the two sub-pixels in each pixel group is enabled to be electrically connected to a same data line, and two adjacent pixel groups are enabled to be electrically connected to different data lines. The symbols "+" and "−" in FIG. 1 indicate the opposite polarities. In a case where the polarities of the plurality of data lines alternately change in an odd-even alternating manner along the row direction, the polarities of the plurality of sub-pixels are capable of being flipped by 2 pixel dots in units of pixel group, that is, two sub-pixels in each pixel group have the same polarity, and adjacent pixel groups have opposite polarities, thus enabling to eliminate most of vertical lines on images to a certain extent, to alleviate the undesirable display phenomena such as the vertical lines.

Figure 2B:
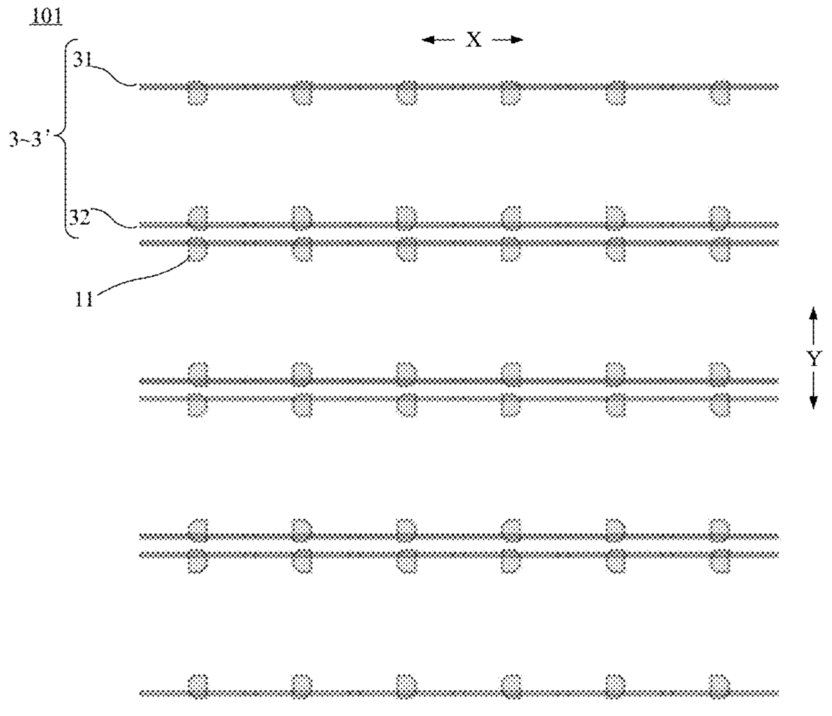
FIG. 2B is a structural diagram of gate lines of an array substrate in accordance with some embodiments.
Figure 2C:
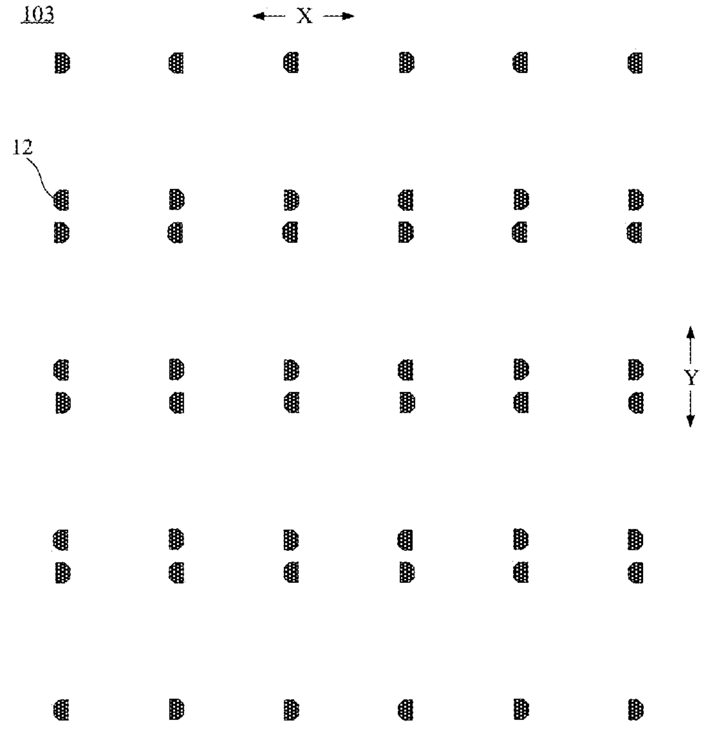
FIG. 2C is a structural diagram of active layers of an array substrate in accordance with some embodiments.
Figure 2D:
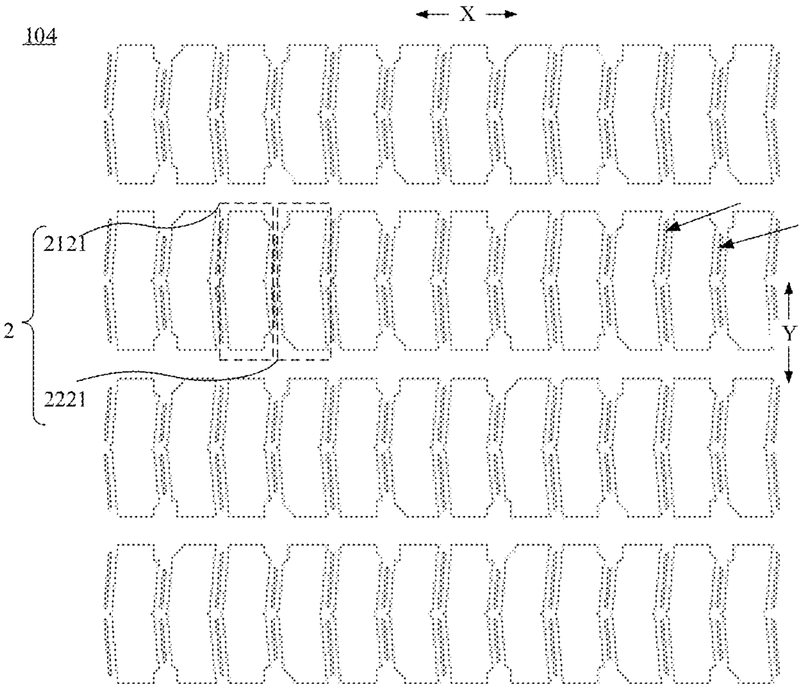
FIG. 2D is a structural diagram of pixel electrodes of an array substrate in accordance with some embodiments.
Figure 2E:
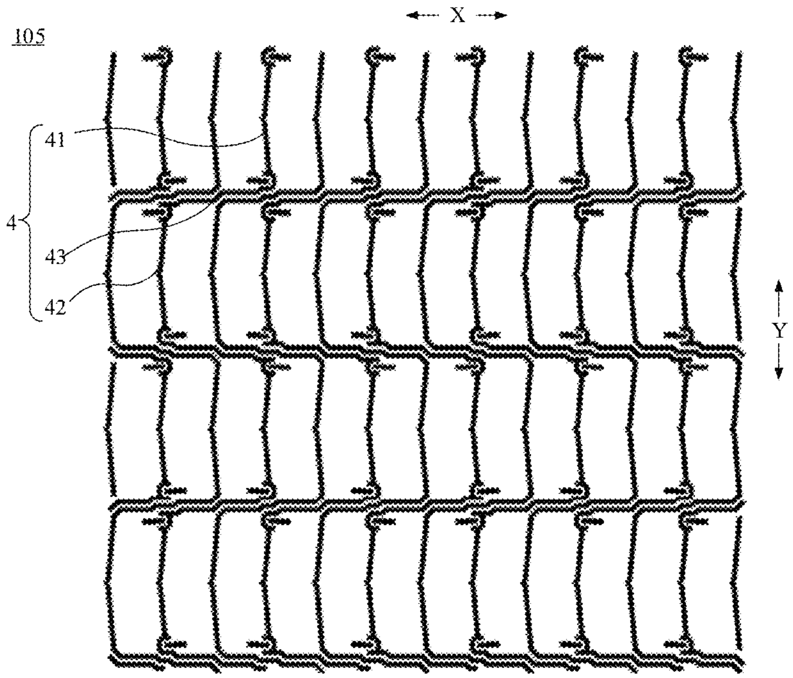
FIG. 2E is a structural diagram of data lines of an array substrate in accordance with some embodiments.
Figure 2F:
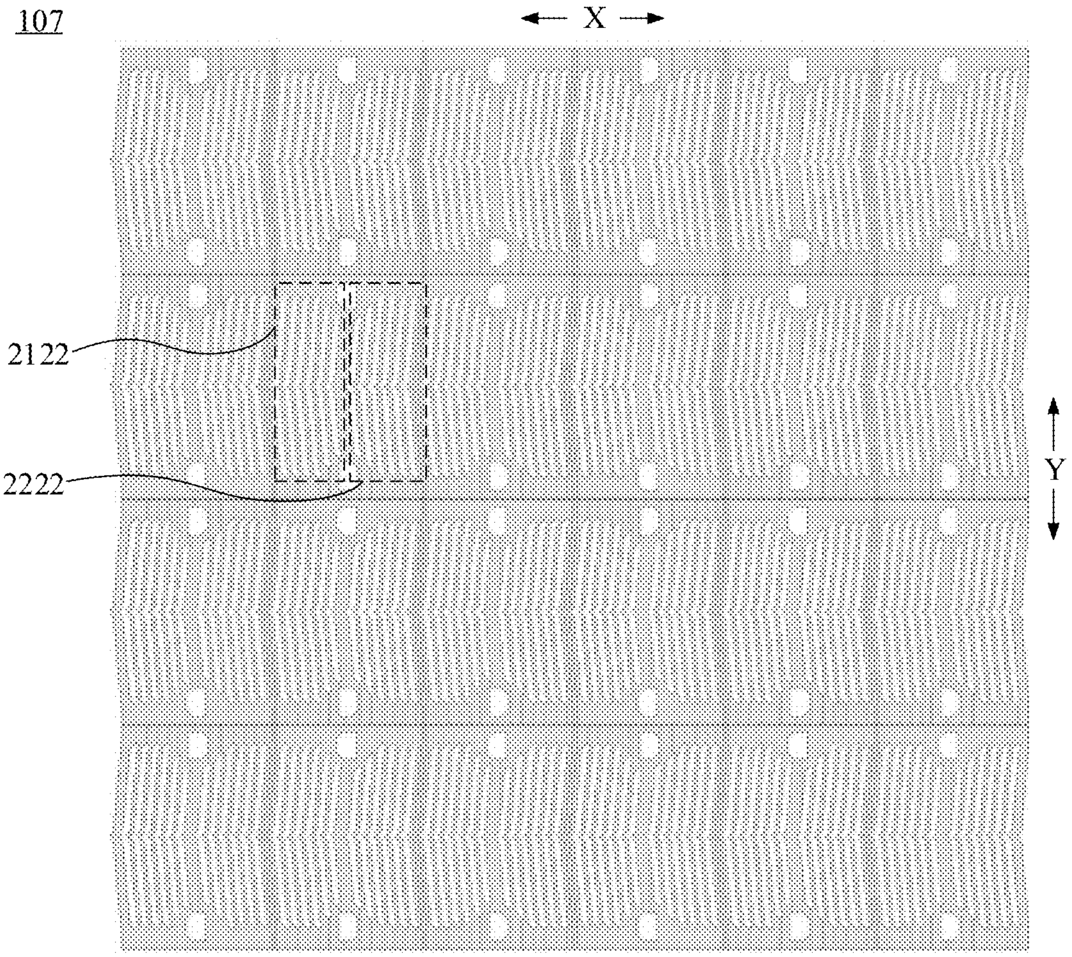
FIG. 2F is a structural diagram of a common electrode of an array substrate in accordance with some embodiments.

FIG. 2B to FIG. 2F are schematic diagrams of various film layers of the plurality of pixel groups. As shown in FIG. 2B to FIG. 2F, the array substrate includes a base substrate, and a gate layer 101, a semiconductor layer 103, a pixel electrode layer 104, a source-drain metal layer 105 and a common electrode layer 107 (collectively referred to as functional layers) disposed sequentially on the base substrate. For example, the semiconductor layer 103 and the pixel electrode layer 104 are located in a same layer. Alternatively, the gate layer 101, the semiconductor layer 103, the source-drain metal layer 105, the pixel electrode layer 104, and the common electrode layer 107 (collectively referred to as functional layers) may be disposed sequentially on the base substrate. Alternatively, the gate layer 101, the pixel electrode layer 104, the semiconductor layer 103, the source-drain metal layer 105, and the common electrode layer 107 (collectively referred to as functional layers) may be disposed sequentially on the base substrate. The array substrate further includes insulating layers (e.g., the insulating layers 109 and 111) each disposed between two adjacent functional layers. Here, FIG. 2B is a layout structure diagram of the plurality of gate lines 3'. The plurality of gate lines 3' are arranged in a plurality of gate line groups 3, in which each gate line group 3 includes a first gate line 31 and a second gate line 32, and each gate line 3' is evenly connected to gate electrodes 11 of multiple transistors. FIG. 2C is a structural diagram of the semiconductor layer 103. The semiconductor layer 103 includes active layers 12 of a plurality of transistors. A material of the semiconductor layer 103 may be, for example, amorphous silicon, low-temperature polysilicon, metal oxide semiconductor, or the like, which is not limited here. FIG. 2D is a structural diagram of the pixel electrode layer 104. The pixel electrode layer 104 includes a plurality of pixel electrodes arranged in an array. The first pixel electrode 2121 and the second pixel electrode 2221 in each pixel group 2 have a same extension direction. Along the row direction X, two adjacent pixel electrodes are provided with a spare data line (as indicated by the arrowed lines) therebetween. The spare data line is electrically connected to a data line and is configured to assist in transmitting data signals or to act as a normal data line to transmit data signals in the event of a failure of the data line electrically connected thereto. Optionally, spare data lines can be set with different lengths, for example, along the row direction X, adjacent spare data lines have different lengths. FIG. 2E is a structural diagram of the source-drain metal layer. The source-drain metal layer includes the plurality of data lines. It can be seen from the figure that each data line 4 is presented in a shape of square wavy, and each data line 4 includes first data segments 41 and second data segments 42 extending along the column direction Y, and third data segments 43 extending along the row direction X, where the third data segments 43 are each electrically connected between a first data segment 41 and a second data segment 42. In addition, the source-drain metal layer further includes first electrodes and second electrodes of the plurality of transistors, in which the first electrodes of the transistors are each connected to a data line. FIG. 2F is a structural diagram of the common electrode layer 107. In the figure, common electrodes are arranged in a mesh structure, and common electrodes of all sub-pixels are electrically connected to form a whole. It can be understood that a common electrode in a sub-pixel is a portion of the common electrode layer overlapping with a pixel electrode of the sub-pixel.

Figure 3A:
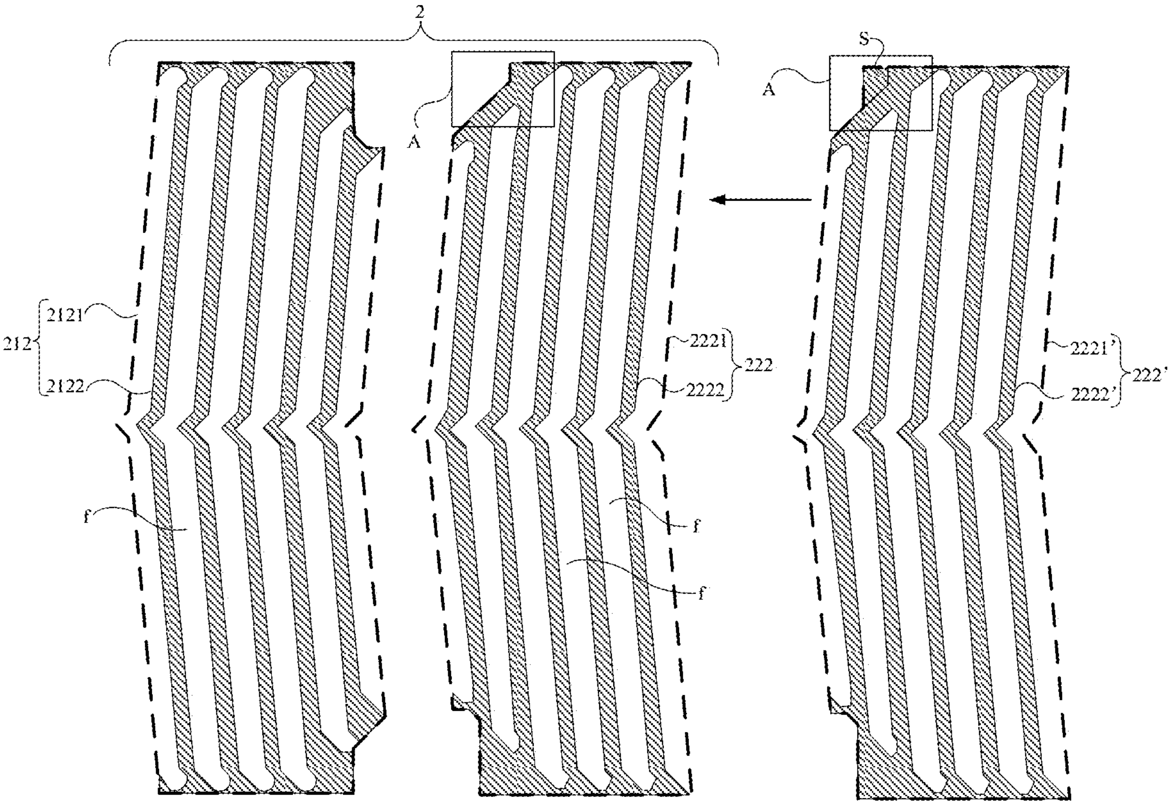
FIG. 3A is a structural diagram showing pixel electrodes overlapping a common electrode in an array substrate in accordance with some embodiments.

In some embodiments, referring to FIG. 3A, an overlapping area of the first pixel electrode 2121 and the first common electrode 2122 is equal to an overlapping area of the second pixel electrode 2221 and the second common electrode 2222.

For example, in one pixel group 2, a first transistor 211 and a second transistor 221 are located between two electrode groups, i.e., a first electrode groups and a second electrode group. In a case, the first transistor 211 and the second transistor 221 are not identical in shape, arrangement and placement, so a shape of a boundary of the first pixel electrode 2121 proximate to the two transistors is different a shape of a boundary of the second pixel electrode 2221 proximate to the two transistors, resulting in the first pixel electrode 2121 and the second pixel electrode 2221 having different areas. As a result, an overlapping area of the first pixel electrode 2121 and the first common electrode 2122 is different from an overlapping area of the second pixel electrode 2221 and the second common electrode 2222, that is, the first sub-pixel 21 and the second sub-pixel 22 have different capacitance magnitudes, which can cause the display of the sub-pixels to be biased, affecting the display effect.

Referring to FIG. 3A, by setting the overlapping area of the first pixel electrode 2121 and the first common electrode 2122 to be equal to the overlapping area of the second pixel electrode 2221 and the second common electrode 2222, it can be ensured that the magnitude of the capacitance formed between the first pixel electrode 2121 and the first common electrode 2122 is consistent with the magnitude of the capacitance formed between the second pixel electrode 2221 and the second common electrode 2222. In this way, the intensity of an electric field formed by the first electrode group is consistent with the intensity of an electric field formed by the second electrode group, driving portions of a liquid crystal layer corresponding to the two electrode groups to undergo a same deflection to allow the same amount of light to pass through, and thus avoiding undesirable phenomena, such as flickering and vertical lines, in a displayed image.

Figure 3B:
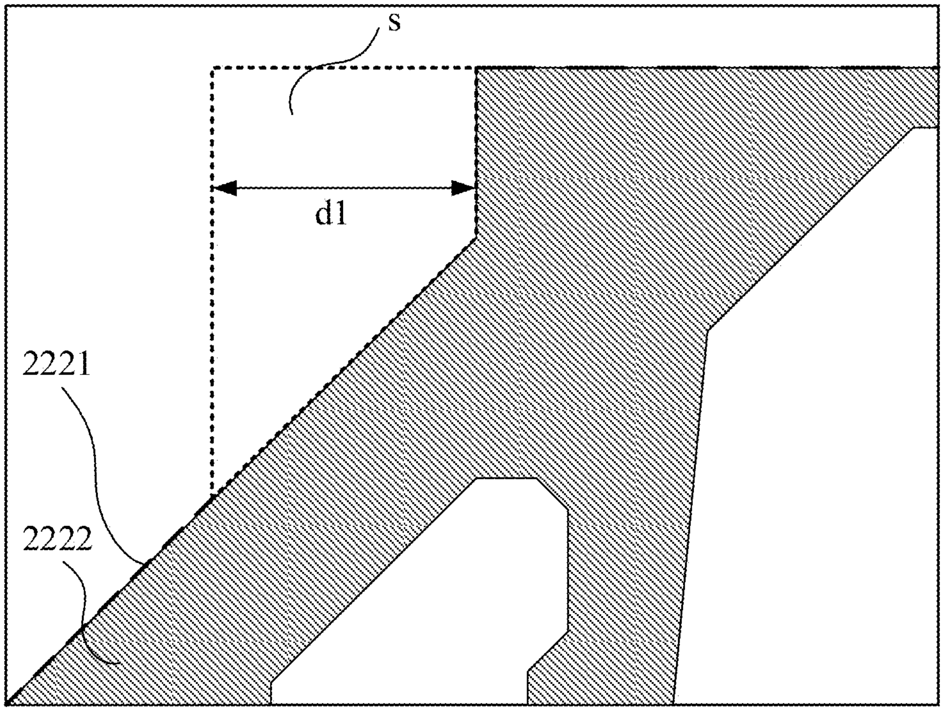
FIG. 3B is a partially enlarged view of the region A in FIG. 3A.

The common electrode layer is a whole-layer structure laid in the display area, and the common electrodes of the plurality of sub-pixels are connected together, so the main way to adjust the overlapping area of a pixel electrode and a common electrode is to adjust the shape of the pixel electrode. As shown in FIG. 3A, the dotted box is an outline of a pixel electrode, in which the pixel group 2 includes a first electrode group 212 and a second electrode group 222, and the right portion of the figure illustrates the structure of a second electrode group 222' without adjustment. For example, before the adjustment is performed, the area of a second pixel electrode 2221' is greater than the area of a first pixel electrode 2121, causing the capacitance formed by the first electrode group 212 and the capacitance formed by the second electrode group 222' to differ in magnitude by 1.6%, to result in 1.2% difference in $\Delta Vp$, which is prone to appearing flickering. FIG. 3B is an enlarged view of the region A in FIG. 3A. Referring to FIG. 3B, a dotted box region is denoted as S, for example, a dimension of the region S in the row direction X is 5.24 μm. A portion, in the region S, of the second pixel electrode 2221' in FIG. 3A is removed to obtain a second pixel electrode 2221 at the left side of FIG. 3A, so an overlapping area of the second pixel electrode 2221 and the second common electrode 2222 is reduced consequently. By adjusting the overlapping area of the second pixel electrode and the second common electrode in the second electrode group, and without adjusting the first electrode group, the overlapping area of the first pixel electrode 2121 and the first common electrode 2122 is enabled to be made equal to the overlapping area of the second pixel electrode 2221 and the second common electrode 2222, and the capacitance formed by the second electrode group is made to be consistent with the capacitance formed by the first electrode group, thereby avoiding undesirable phenomena, such as flickering and vertical lines, in a displayed image.

In some embodiments, as shown in FIG. 4, at least a portion of a data line 4 connected to a pixel group 2 is located between a first electrode group 212 and a second electrode group 222 of the pixel group 2, where the at least a portion of the data line 4 is a first data segment 41 or a second data segment 42. A first electrode 211_a_ of a first transistor 211 and a first electrode 221_a_ of a second transistor 221 are both connected to the above data line 4, a second electrode 211_b_ of the first transistor 211 is connected to the first pixel electrode 2121, and a second electrode 221_b_ of the second transistor 221 is connected to the second pixel electrode 222. A direction that is from the first electrode 211_a_ to the second electrode 211_b_ of the first transistor 211 and parallel to the row direction X is a first direction F1, and a direction that is from the first electrode 221_a_ to the second electrode 221_b_ of the second transistor 221 and parallel to the row direction X is a second direction F2, where the first direction F1 is opposite to the second direction F2.

For example, referring to FIG. 4, the first direction F1 and the second direction F2 described above are each for a direction in which a first electrode points to a second electrode of a transistor in the pixel group 2. The pixel group shown in FIG. 4 is only one way of example, the first direction F1 and the second direction F2 herein are not fixed, and the specific direction needs to be determined based on the position of the first electrode as well as the second electrode of the transistor. It can be understood that an arrangement, in which the first direction F1 from the first electrode 211_a_ to the second electrode 211_b_ of the first transistor 211 and parallel to the row direction X is opposite to the second direction F2 from the first electrode 221_a_ to the second electrode 221_b_ of the second transistor 221 and parallel to the row direction X, facilitates a spatial arrangement of other structures in the pixel group 2, which makes it easier to enable the overlapping area of the first pixel electrode 2121 and the first common electrode 2122 to be equal to the overlapping area of the second pixel electrode 2221 and the second common electrode 2222.

It will be noted that at least a portion of the data line 4 connected to the pixel group 2 is located between the first electrode group 212 and the second electrode group 222 of the pixel group 2. As shown in FIG. 4, the at least a portion of the data line 4 extends along the column direction Y and is located in the middle of the first electrode group 212 and the second electrode group 222. The at least a portion of the data line 4 is configured to provide data signals, through the first transistor 211 and the second transistor 221, to the first pixel electrode 2121 and the second pixel electrode 2221, respectively. The data signal may be a voltage signal, the magnitude of which corresponds to a bright or dark condition of a display brightness of a sub-pixel.

In some embodiments, the first transistor 211 and the second transistor 221 are arranged in a central symmetry manner.

It will be noted that continuing to refer to FIG. 4, in a region where the pixel group 2 is located, a central symmetry point is O. The first transistor 211 and the second transistor 221 are symmetrical with respect to the central symmetry point O, and a line segment formed by connecting the center of the first transistor 211 with the center of the second transistor 221 passes through the central symmetry point O.

Figure 5:
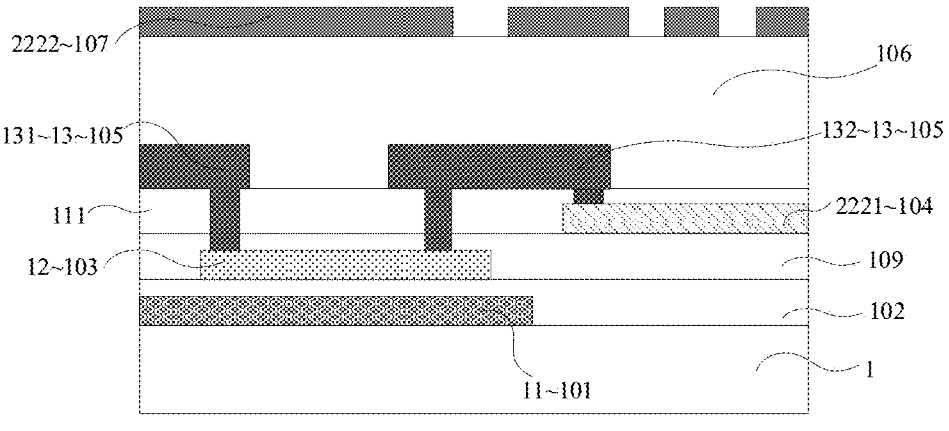
FIG. 5 is a structural diagram of a cross-section taken along the cross-section line CC in FIG. 4.

In some embodiments, referring to FIG. 4 and FIG. 5, the first transistor 211 and the second transistor 221 are bottom-gate transistors. The first transistor 211 and the second transistor 221 each include a gate electrode 11, an active layer 12, and source-drain electrodes 13 that are stacked in sequence. The source-drain electrodes 13 include a first electrode 131 and a second electrode 132 (i.e., the first electrode 211*a* of the first transistor 211 and the first electrode 221*a* of the second transistor 221 are first electrodes 131, and the second electrode 211*b* of the first transistor 211 and the second electrode 221*b* of the second transistor 221 are second electrodes 132). An orthographic projection of the active layer 12 on the base substrate 1 lies within an orthographic projection of the gate electrode 11 on the base substrate 1. At least a portion of an orthographic projection of each of the first electrode 131 and the second electrode 132 on the base substrate 1 lies within the orthographic projection of the active layer 12 on the base substrate 1. An orthographic projection of the first electrode 13 is U-shaped, and an opening of the first electrode 131 faces the second electrode 132.

For example, orthographic projections of the active layers 12 of the first transistor 211 and the second transistor 221 on the base substrate 1 lie within orthographic projections of the gate electrodes 11 on the base substrate 1, which means that the area of the active layer 12 of the first transistor 211 and the area of the active layer 12 of the second transistor 221 are less than the area of the gate electrode 11 of the first transistor 211 and the area of the gate electrode 11 of the second transistor 221, respectively. And at least a portion of the orthographic projection of each of the first electrode 131 and the second electrode 132 on the base substrate 1 lies within the orthographic projection of the active layer 12 on the base substrate 1.

It will be noted that as shown in FIG. 5, combined with FIG. 2B to FIG. 2F, a gate layer 101, a gate insulating layer 102, a semiconductor layer 103, a pixel electrode layer 104, a source-drain metal layer 105, a passivation layer 106, and a common electrode layer 107 are disposed on the base substrate 1 in sequence, in which the semiconductor layer 103 and the pixel electrode layer 104 are located in a same layer, and the source-drain metal layer 105 is disposed on a side of the semiconductor layer 103 and the pixel electrode layer 104 away from the base substrate 1. The gate layer 101 includes gate electrodes 11 of the transistors, the semiconductor layer 103 includes active layers 12 of the transistors, and the pixel electrode layer 104 has a plurality of pixel electrodes (i.e., first pixel electrodes 2121 and second pixel electrodes 2221). As shown in FIG. 2C and FIG. 2D, the shape of a boundary of each of two pixel electrodes proximate to two transistors in the pixel group 2 corresponds to the shapes of active layers 12 the pixel group 2, so as to realize a reasonable spatial layout of the plurality of pixel electrodes and the plurality of active layers disposed in the same layer. The source-drain metal layer 105 includes first electrodes 131 and second electrodes 132 of the transistors. A second electrode 132 of a transistor is in contact with a pixel electrode, so as to achieve an electrical connection; and the first electrode 131 and the second electrode 132 of the transistor are in contact with two ends of the active layer 12 of the transistor, respectively, to realize an electrical connection. The common electrode layer 107 includes a plurality of common electrodes.

The following takes the second transistor as an example to describe the relationship between the gate electrode, the active layer, and the source-drain electrodes of the transistor.

As shown in FIG. 5, FIG. 5 is a cross-sectional view of a second transistor 221 taken along the cross-section line CC in FIG. 4. As can be seen from FIG. 5, an orthographic projection of an active layer 12 of the second transistor 221 on the base substrate 1 lies within an orthographic projection of a gate electrode 11 thereof on the base substrate 1, and at least a portion of an orthographic projection of each of a first electrode 131 and a second electrode 132 of the second transistor 221 on the base substrate 1 lies within the orthographic projection of the active layer 12 on the base substrate 1. The first electrode 131 and the second electrode 132 of the second transistor 221 are electrically connected to the active layer thereof. At least a portion of an orthographic projection of the second electrode 132 of the second transistor 221 on the base substrate 1 lies within an orthographic projection of the pixel electrode layer 104 on the base substrate 1, and the second electrode 132 of the second transistor 221 is electrically connected to a pixel electrode in the pixel electrode layer 104.

In some embodiments, referring to FIG. 2D, FIG. 2F, FIG. 6 and FIG. 7, the first pixel electrode 2121 and the second pixel electrode 2221 are block electrodes, and the first common electrode 2122 and the second common electrode 2222 are strip electrodes. As shown in FIG. 3A, the first common electrode 2122 and the second common electrode 2222 each include a plurality of slits f. An aperture ratio of the first sub-pixel 21 is equal to an aperture ratio of the second sub-pixel 22.

Figure 6:
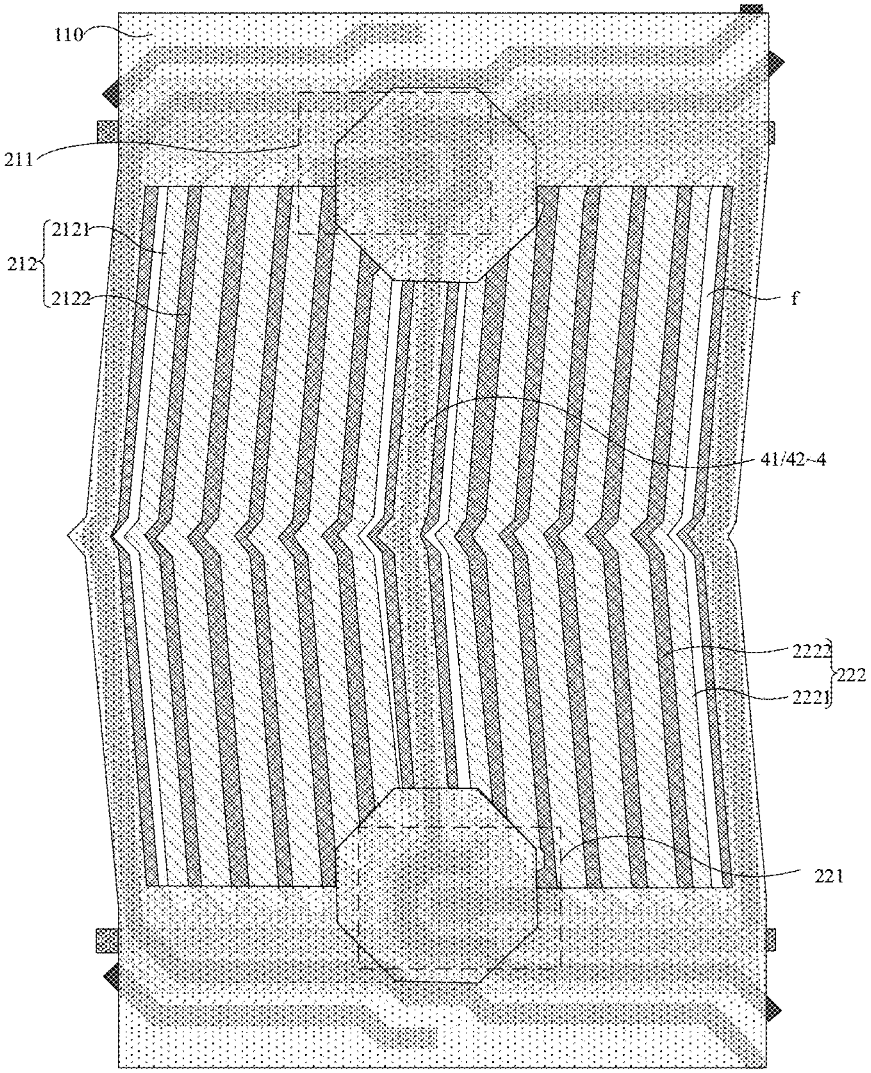
FIG. 6 is another structural diagram of a pixel group of an array substrate in accordance with some embodiments.
Figure 7:
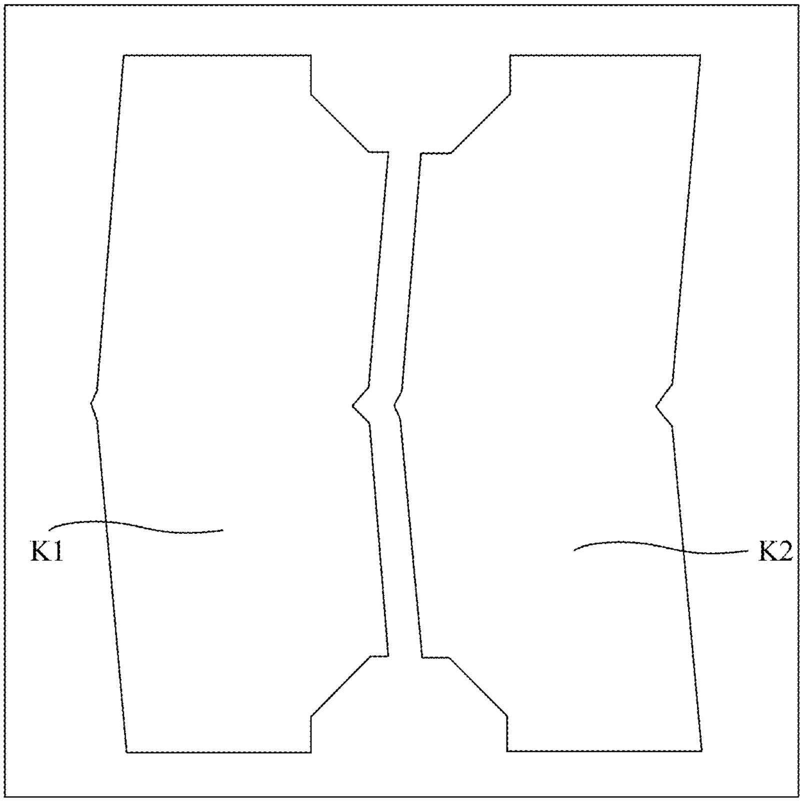
FIG. 7 is a structural diagram of pixel openings of a pixel group of an array substrate in accordance with some embodiments.

For example, referring to FIG. 6, the first pixel electrode 2121 and the second pixel electrode 2221 are arranged side by side, and the first common electrode 2122 and the second common electrode 2222 each include a plurality of slits f, where each slit f extends along the column direction as a whole. A black matrix layer 110 is provided above the pixel group 2, where the black matrix layer 110 is used to block light. An actual light-transmitting region in a sub-pixel is a region that is not blocked by the black matrix layer 110. The aperture ratio of the first sub-pixel 21 is equal to the aperture ratio of the second sub-pixel 22, that is, a ratio of an actual light-transmitting area of the first sub-pixel 21 to a total area thereof is equal to a ratio of an actual light-transmitting area of the second sub-pixel 22 to a total area thereof, thereby ensuring light extraction efficiency. Referring to FIG. 7, FIG. 7 is a structural diagram of pixel openings of the first sub-pixel and the second sub-pixel, where a pixel opening of the first sub-pixel is a first pixel opening K1, and a pixel opening of the second sub-pixel is a second pixel opening K2. The area of the first pixel opening K1 is equal to the area of the second pixel opening K2.

Figure 8:
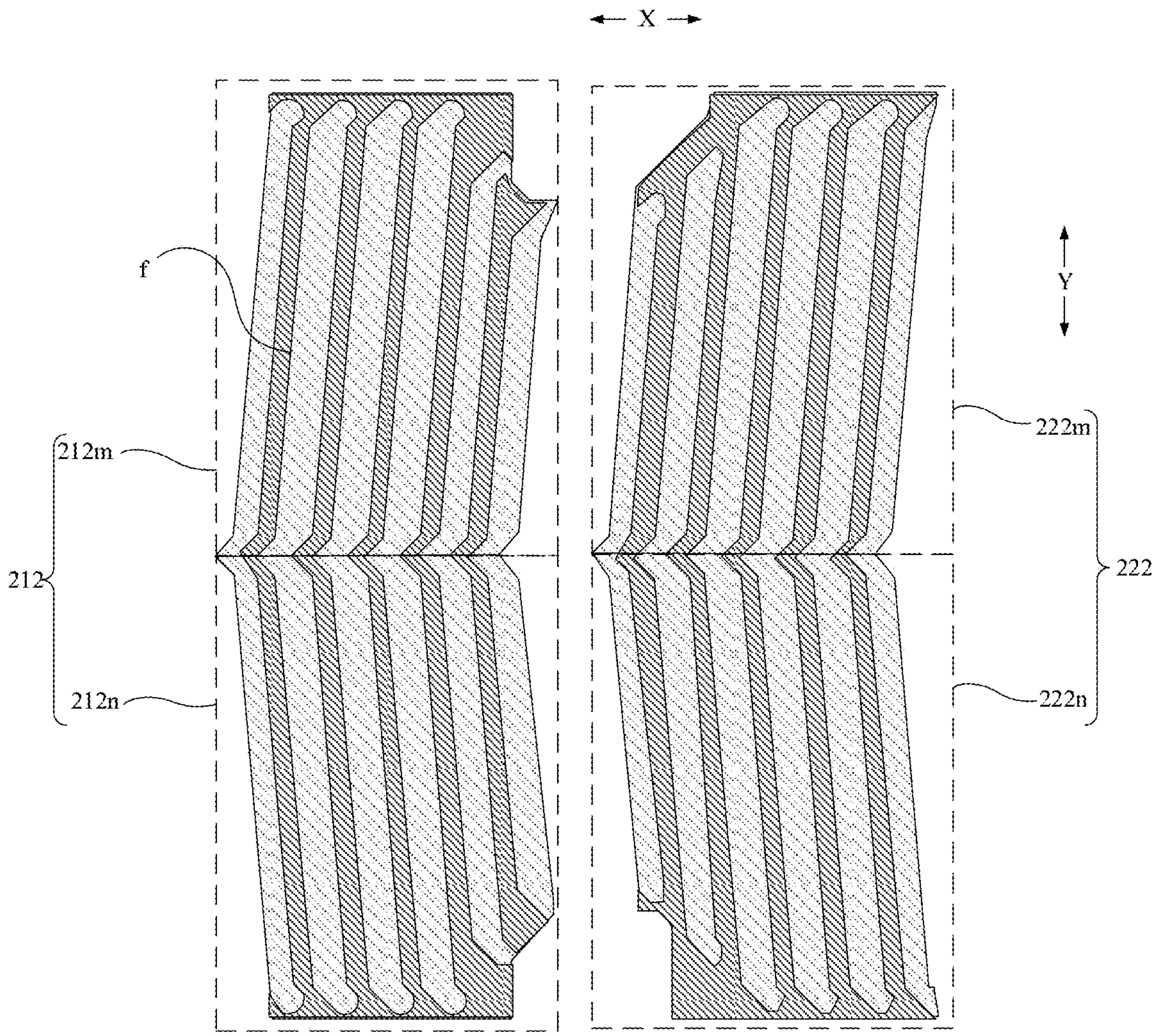
FIG. 8 is a structural diagram of domain regions of a pixel group of an array substrate in accordance with some embodiments.

In some embodiments, referring to FIG. 8, the first electrode group 212 includes a first domain region 212*m* and a second domain region 212*n* arranged along the column direction Y, and the second electrode group 222 includes a third domain region 222*m* and a fourth domain region 222*n* arranged along the column direction Y. The first domain region 212*m*, the second domain region 212*n*, the third domain region 222*m*, and the fourth domain region 222*n* have a same aperture ratio.

For example, the first domain region 212*m* is adjoined to the second domain region 212*n*, and the third domain region

222*m* is adjoined to the fourth domain region 222*n*. The first domain region 212*m*, the second domain region 212*n*, the third domain region 222*m*, and the fourth domain region 222*n* have the same area, that is, aperture ratios of the domain regions of the first electrode group 212 and the second electrode group 222 are equal, which can ensure that each domain region of the first electrode group 212 and the second electrode group 222 has the same light output efficiency and the light is homogeneous.

Figure 9A:
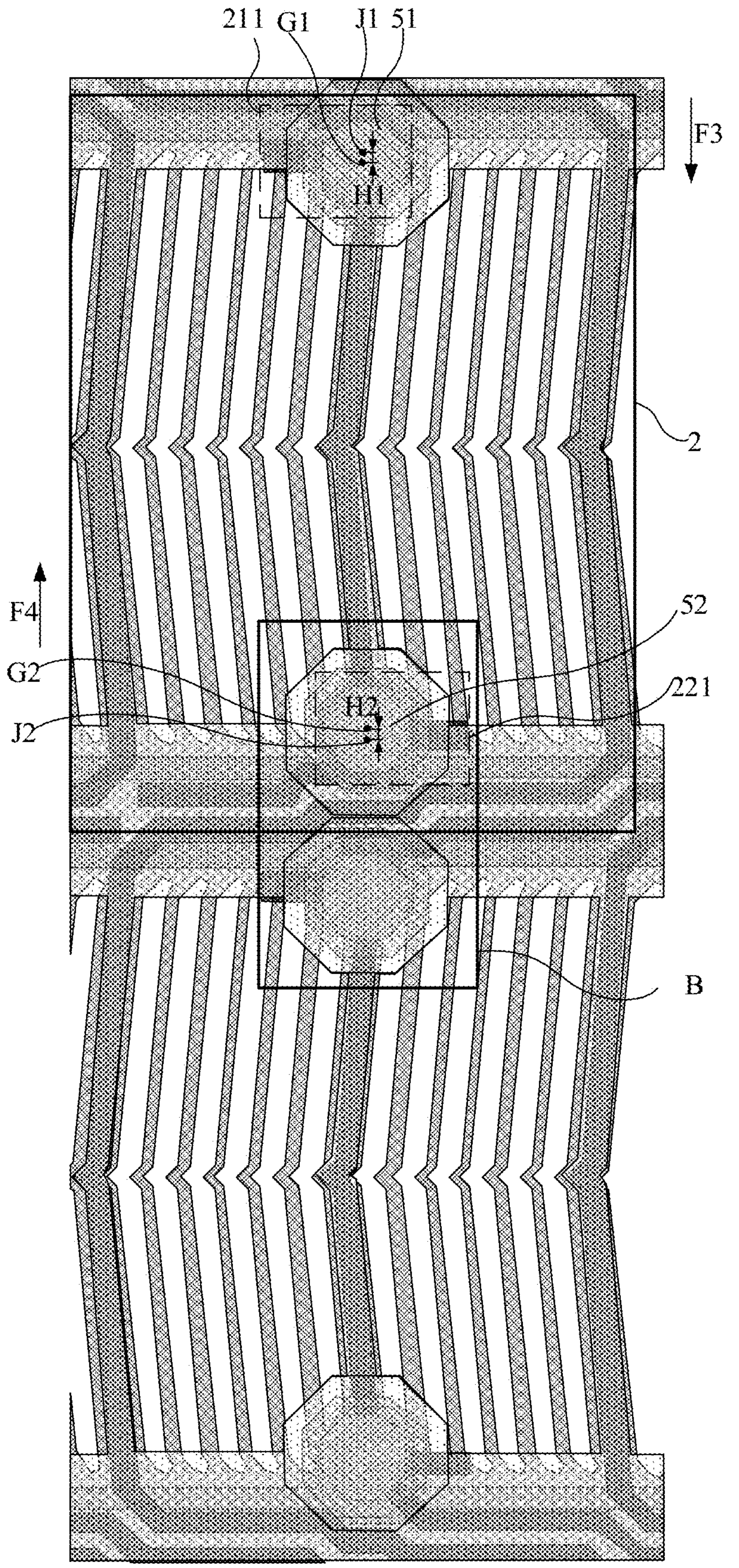
FIG. 9A is yet another structural diagram of a pixel group of an array substrate in accordance with some embodiments.
Figure 9B:
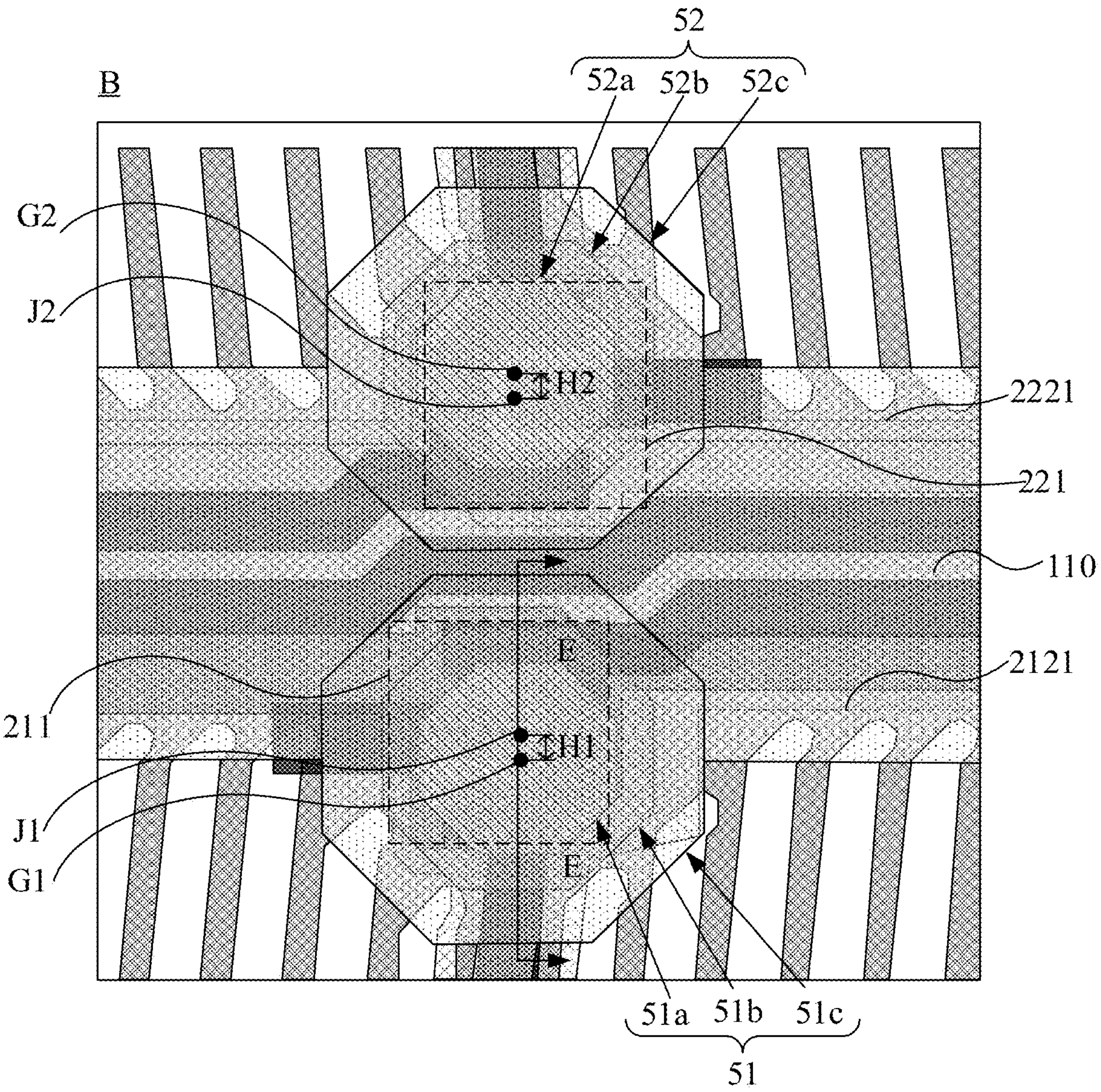
FIG. 9B is a partially enlarged view of the region B in FIG. 9A.
Figure 9C:
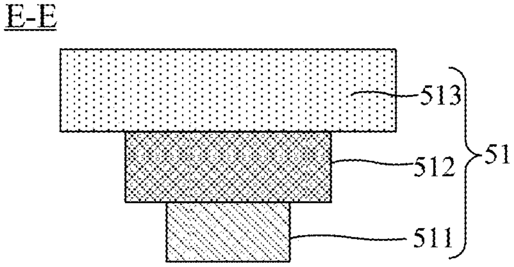
FIG. 9C is a structural diagram of a cross-section of a first spacer taken along the cross-section line EE in FIG. 9B.

In some embodiments, referring to FIG. 9A to FIG. 9C, the array substrate 10 further includes: first spacers 51, a first spacer 51 being disposed on a side of the first transistor 211 away from the base substrate 1, and second spacers 52, a second spacer 52 being disposed on a side of the second transistor 221 away from the base substrate 1. The first spacers 51 and the second spacers 52 play a supporting role and form a space for placing the liquid crystal layer of the display panel.

In some examples, due to the influence of the placement of the transistor, insufficient blocking of light may occur at the position of the black matrix layer 110 proximate to the transistors, resulting in an abnormal light performance. The first spacers 51 and the second spacers 52 are able to play the role of blocking light and have an influence on the aperture ratios of the sub-pixels. By adjusting the position of the first spacer 51 and the second spacer 52, the blocking ability of light can be ensured while the effect of the first spacer 51 and the second spacer 52 on the aperture ratios of the two sub-pixels remains consistent.

As shown in FIG. 9C, taking the first spacer 51 as an example, the first spacer 51 includes a first part 511, a second part 512 and a third part 513 that are stacked in sequence. The first part 511 is closer to the base substrate than the second part 512. An orthographic projection of the first part 511 on the base substrate lies within an orthographic projection of the second part 512 on the base substrate, and the orthographic projection of the second part 512 on the base substrate lies within an orthographic projection of the third part 513 on the base substrate. As can be seen in conjunction with FIG. 9C, in some examples, the first part 511 and the second part 512 can form a one-piece structure. That is, the first part 511 may be considered to be a plane of the one-piece structure facing the base substrate, and the second part 512 may be considered to be the other plane of the one-piece structure opposite the former plane. As shown in FIG. 9B, a boundary 51*c* of the orthographic projection of the third part 513 on the base substrate surrounds a boundary 51*b* of the orthographic projection of the second part 512 on the base substrate, and the boundary 51*b* of the orthographic projection of the second part 512 on the base substrate surrounds a boundary 51*a* of the orthographic projection of the first part 511 on the base substrate The third part 513 is located in a same layer as the black matrix layer 110. It can be considered that third parts of the first spacers and the second spacers belong to the black matrix layer.

A center G1 of an orthographic projection of the first spacer 51 on the base substrate 1 is offset a first distance H1 in a third direction F3 relative to a center J1 of an orthographic projection of the first transistor 211 on the base substrate 1, where the third direction F3 is a direction in which the first transistor 211 points to the second transistor 221; and a center G2 of an orthographic projection of the second spacer 52 on the base substrate 1 is offset a second distance H2 in a fourth direction F4 relative to a center J2 of an orthographic projection of the second transistor 221 on the base substrate 1, where the fourth direction F4 is a direction in which the second transistor 221 points to the first transistor 211.

It will be noted that the first transistor 211 and the second transistor 221 here are two transistors in the same pixel group, and the third direction F3 and the fourth direction F4 above-mentioned are also determined based on the two transistors in the pixel group.

As shown in FIG. 9A, a side of the black matrix layer 110 proximate to the first transistor and a side of the black matrix layer 110 proximate to the second transistor may leak light, so the first spacer is offset toward the third direction F3 by the first distance H1, to shield a position of the black matrix layer 110 proximate to the first transistor 211, and the second spacer 52 is offset toward the fourth direction F4 by the second distance H2, to shield a position of the black matrix layer 110 proximate to the second transistor 221. In this way, the problem of insufficient blocking of light by the black matrix layer is compensated to ensure that there is no display abnormality caused by light leakage, and in addition, the design of the spacer offset prevents the problem of sticking between two spacers in close proximity to each other.

In some embodiments, as shown in FIG. 9B, the first distance H1 is equal to the second distance H2.

It will be noted that in order to clearly illustrate the offset distances, a first transistor and a second transistor in adjacent pixel groups are shown in FIG. 9B as an example to describe the above first transistor and the second transistor. The first spacer 51 and the second spacer 52 are set to have the same offset distance, mainly to ensure that the first domain region 212*m*, the second domain region 212*n*, the third domain region 222*m*, and the fourth domain region 222*n* have the same aperture ratio, which in turn ensures the light output efficiency. Moreover, referring to FIG. 9B and FIG. 9C, since the first spacer 51 and the second spacer 52 have a columnar structure, liquid crystal molecules surrounding them are deflected in a disordered manner, which is prone to the phenomenon of light leakage, and setting the offset distances is able to prevent the phenomenon of light leakage.

In some embodiments, continuing to refer to FIG. 9B, an orthographic projection of the third part 513 of the first spacer 51 on the base substrate 1 has an overlap with orthographic projections of the first pixel electrode 2121 and the second pixel electrode 2221 on the base substrate 1; and an orthographic projection of the third part 513 of the second spacer 52 on the base substrate 1 has an overlap with the orthographic projections of the first pixel electrode 2121 and the second pixel electrode 2221 on the base substrate 1.

As shown in FIG. 9B, the boundary 51*c*, located outermost, of the orthographic projection of the third part 513 of the first spacer 51 on the base substrate 1 intersects with both the boundary of the orthographic projection of the first pixel electrode 2121 and the boundary of the orthographic projection of the second pixel electrode 2221; and as shown in FIG. 9B, the boundary 52*c*, located outermost, of the orthographic projection of the third part 513 of the second spacer 52 on the base substrate 1 intersects with both the boundary of the orthographic projection of the first pixel electrode 2121 and the boundary of the orthographic projection of the second pixel electrode 2221. Through the overlapping design, it can ensure that a region between the transistor and the pixel electrode is shielded, effectively avoiding light leakage.

For example, the first spacer 51 and the second spacer 52 aforementioned may be disposed on a color filter (CF) substrate or may be disposed on the array substrate, where the color filter substrate is also referred to as an opposite substrate. The liquid crystal layer is disposed between the color filter substrate and the array substrate. The color film substrate may be provided with the black matrix layer and a color filter layer therein. The color filter layer includes a plurality of filter units with different colors, such as red, green, and blue filter units formed by using red, green, and blue photo-polymeric resins, and each filter unit corresponds to a sub-pixel. The black matrix layer is used to define boundaries between respective filter units, to prevent light leakage between adjacent filter units.

Figure 10:
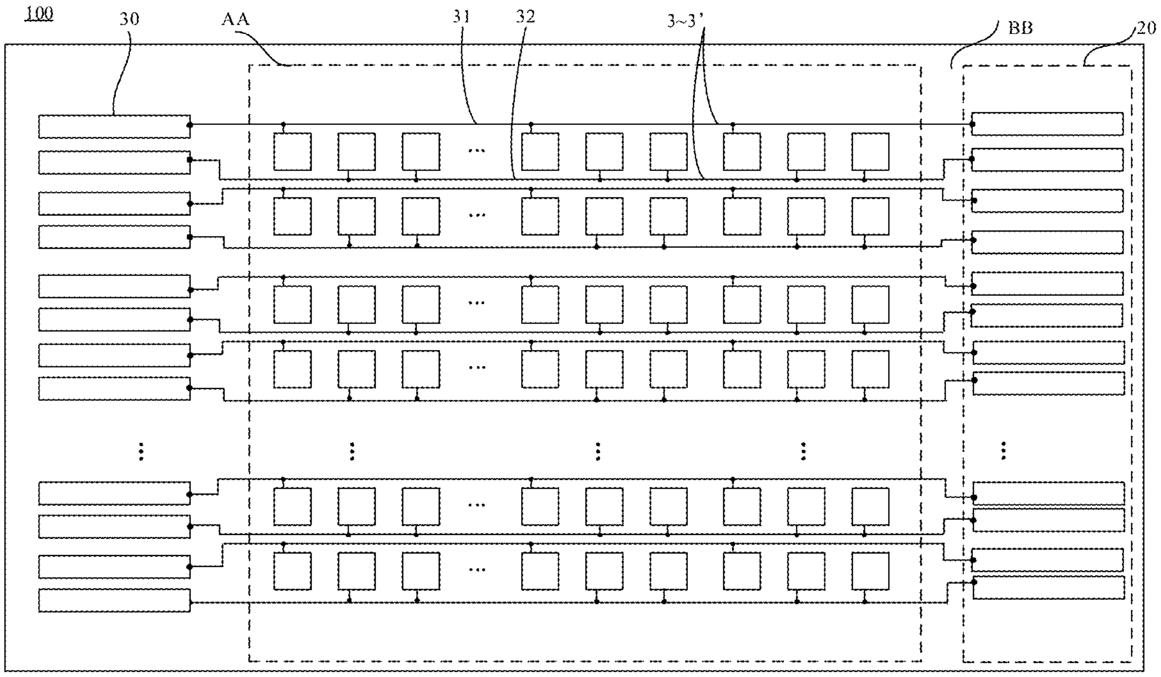
FIG. 10 is a structural diagram of a display panel in accordance with some embodiments.

As shown in FIG. 10, some embodiments of the present disclosure further provide a display panel 100, which includes a display area AA and a peripheral area BB disposed at the periphery of the display area AA. The display panel includes an array substrate 10 provided in any of the above embodiments and at least one gate driving circuit 20 disposed on the base substrate 1. The plurality of pixel groups 2 are disposed in the display area AA, and the gate driving circuit 20 is disposed in the peripheral area BB. The gate driving circuit 20 includes N shift registers 30 cascaded.

The gate driving circuit 20 is used to output gate signals to the display area to control each sub-pixel to turn on and to perform the inputting of a data signal. The plurality of gate lines 3' are arranged sequentially along the column direction, and a plurality of first gate lines 31 and a plurality of second gate lines 32 are alternately arranged. In the N shift registers 30 cascaded, the shift register 30 is electrically connected to a gate line 3' and outputs a gate scanning signal to the gate line 3'.

For example, referring to FIG. 10, the display panel includes two gate driving circuits 20. The two gate driving circuits 20 are respectively located on two sides of the display area. In the two gate driving circuits 20, shift registers at a same stage are electrically connected to a same gate line. For example, in the two gate driving circuits, shift registers at the first stage are both electrically connected to a first gate line, and simultaneously output a gate scan signal to this gate line. Using this method can improve driving efficiency, save scanning time, enable the plurality of sub-pixels to be turned on faster to write data signals, and improve the display effect. Optionally, the present disclosure may also support unilateral driving, that is, one gate driving circuit is disposed in one side of the display area, which is not limited here.

The shift register 30 includes an input terminal, an output terminal and a reset terminal. In some examples, a cascade relationship of the N shift registers 30 is that: an output terminal of a shift register at an i-th stage is connected to an input terminal of a shift register at a (i+n)-th stage, and an output terminal of the shift register at the (i+n)-th stage is connected to a reset terminal of the shift register at the i-th stage, where i and n are each an integer greater than or equal to 1. This cascade mode is called a conventional reset cascade mode, that is, a shift register at one stage carries a shift register at an n-th stage arranged thereafter, and is reset by that shift register.

It will be noted that, the output terminal of the shift register may be an output terminal responsible for outputting a gate scanning signal, which is electrically connected to a gate line and outputs a gate scanning signal to the gate line, or may be an output terminal responsible for cascading, where the output terminal responsible for cascading serves as a cascade carry and reset, and is not electrically connected to the gate lines in the display area. That is, the shift register has two output terminals with different functions. In some examples, the shift register has one output terminal that is connected to a gate line and is responsible for cascading.

In some other embodiments of the present application, a cascade relationship of the N shift registers 30 is that: an output terminal of a shift register at an i-th stage is connected to an input terminal of a shift register at a (i+n)-th stage, and an output terminal of a shift register at (i+n+2j)-th stage is connected to a reset terminal of the shift register at the i-th stage, where j is an integer greater than or equal to 1. This cascade mode is called a delayed reset cascade mode, that is, a shift register at one stage outputs a carry signal to a shift register (called a carry shift register) at an n-th stage arranged thereafter, and is reset by a shift register at a 2j-th stage arranged after the carry shift register, which means that there is a delay of 2j rows before the reset is performed.

Figure 11A:
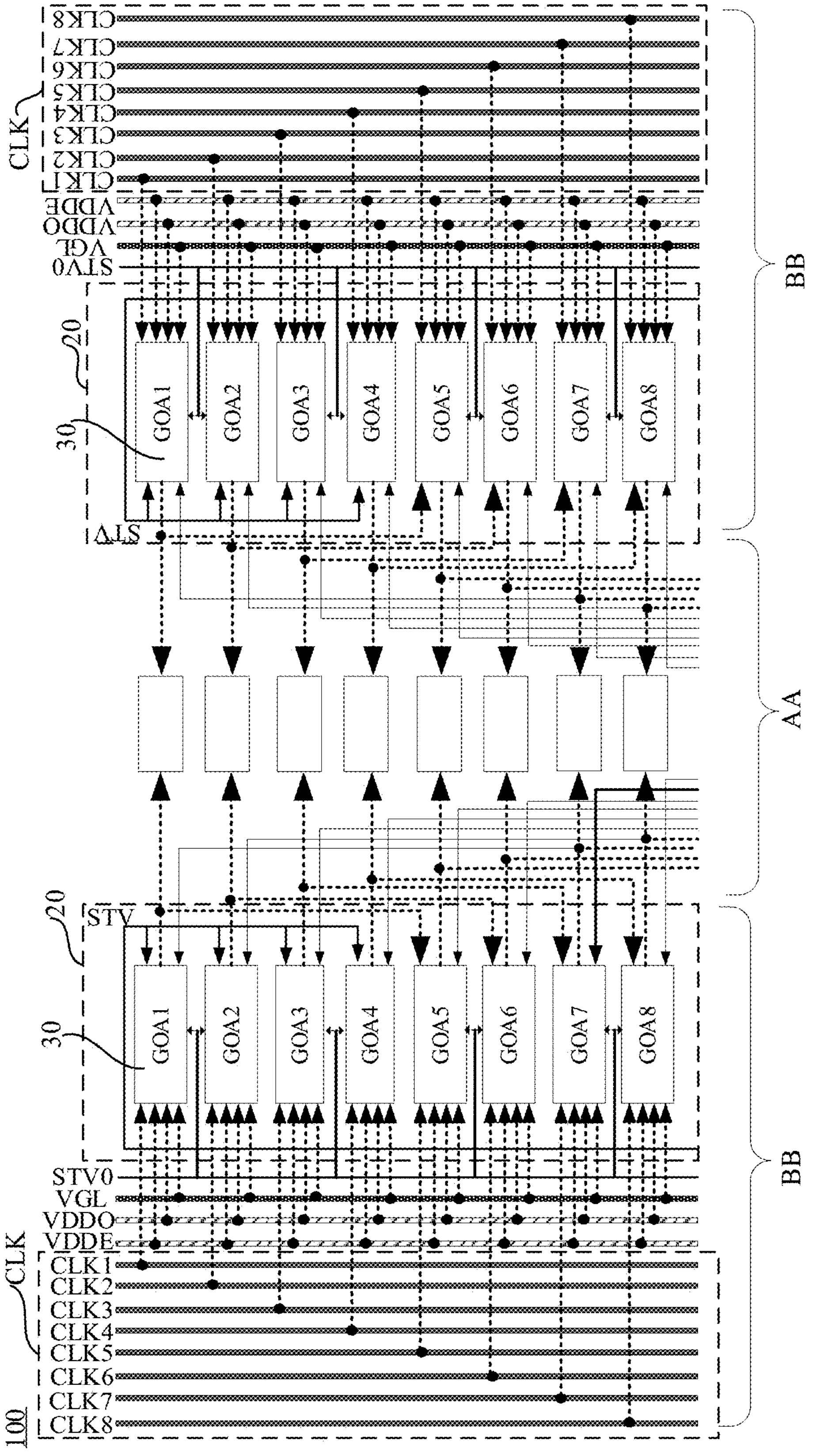
FIG. 11A is another structural diagram of a display panel in accordance with some embodiments.

For example, as shown in FIG. 11A, FIG. 11A shows cascaded shift registers 30 at the first eight stages included in the gate driving circuit 20, e.g., GOA (gate on array) 1, GOA2, GOA3, GOA4, GOA5, GOA6, GOA7, and GOA 8, where n=4 and j=1. When i takes a value of 1, i.e., i=1, i+n=5 and i+n+2j=7, that is, an output terminal of a shift register at the first stage is connected to an input terminal of a shift register at the fifth stage, and an output terminal of a shift register at the seventh stage is connected to a reset terminal of the shift register at the first stage; and when i takes a value of 2, i.e., i=2, i+n=6 and i+n+2j=8, that is, an output terminal of a shift register at the second stage is connected to an input terminal of a shift register at the sixth stage, and an output terminal of a shift register at the eighth stage is connected to a reset terminal of the shift register at the second stage; and so on without further elaboration.

In some examples, input terminals of shift registers at the first n stages in the N shift registers are connected to an initialization signal line STV, and reset terminals of shift registers at the last (n+2j) stages are connected to the initialization signal line. The shift registers at the last (n+2j) stage are, for example, dummy shift registers. For example, continuing to refer to FIG. 11A, it can be seen that input terminals of shift registers at the first four stages in the N shift registers are connected to the initialization signal line STV, and reset terminals of shift registers at the last six stages are connected to the initialization signal line.

It will be noted that the above cascade relationship uses a delay of 2j rows for reset, e.g., a delay of two rows of reset. By using the delay of even-numbered rows for reset can support the implementation of the timing signal odd-even alternation, which is described in detail below.

Figure 11B:
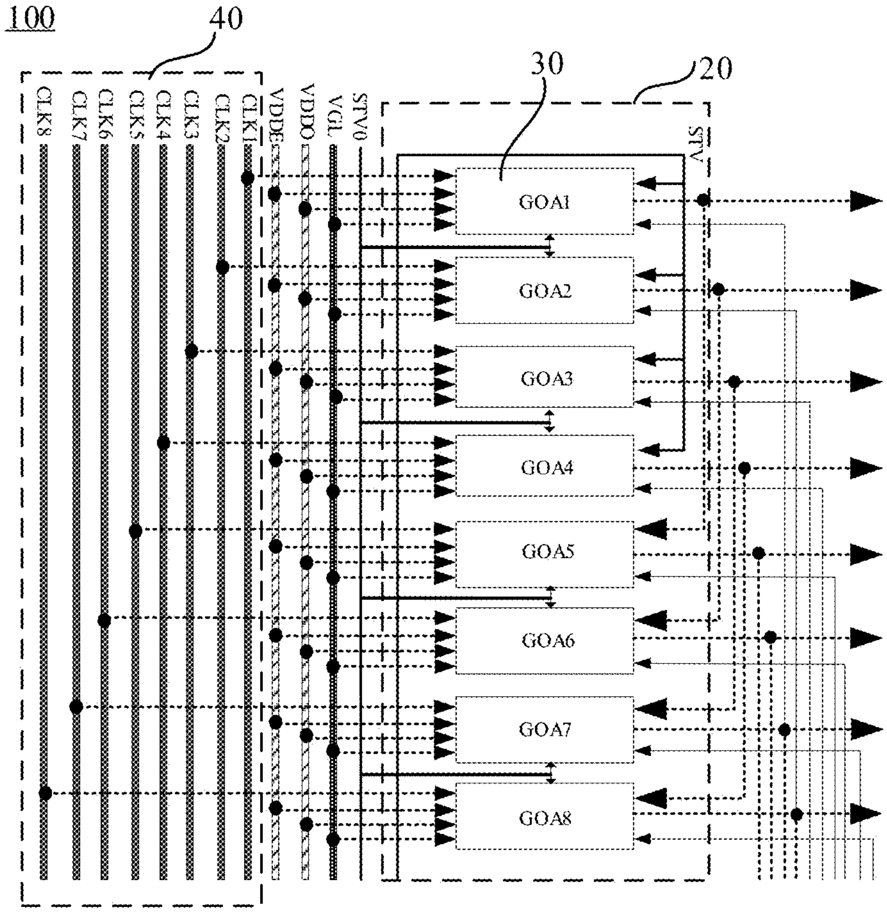
FIG. 11B is an enlarged view obtained based on FIG. 11A.
Figure 11C:
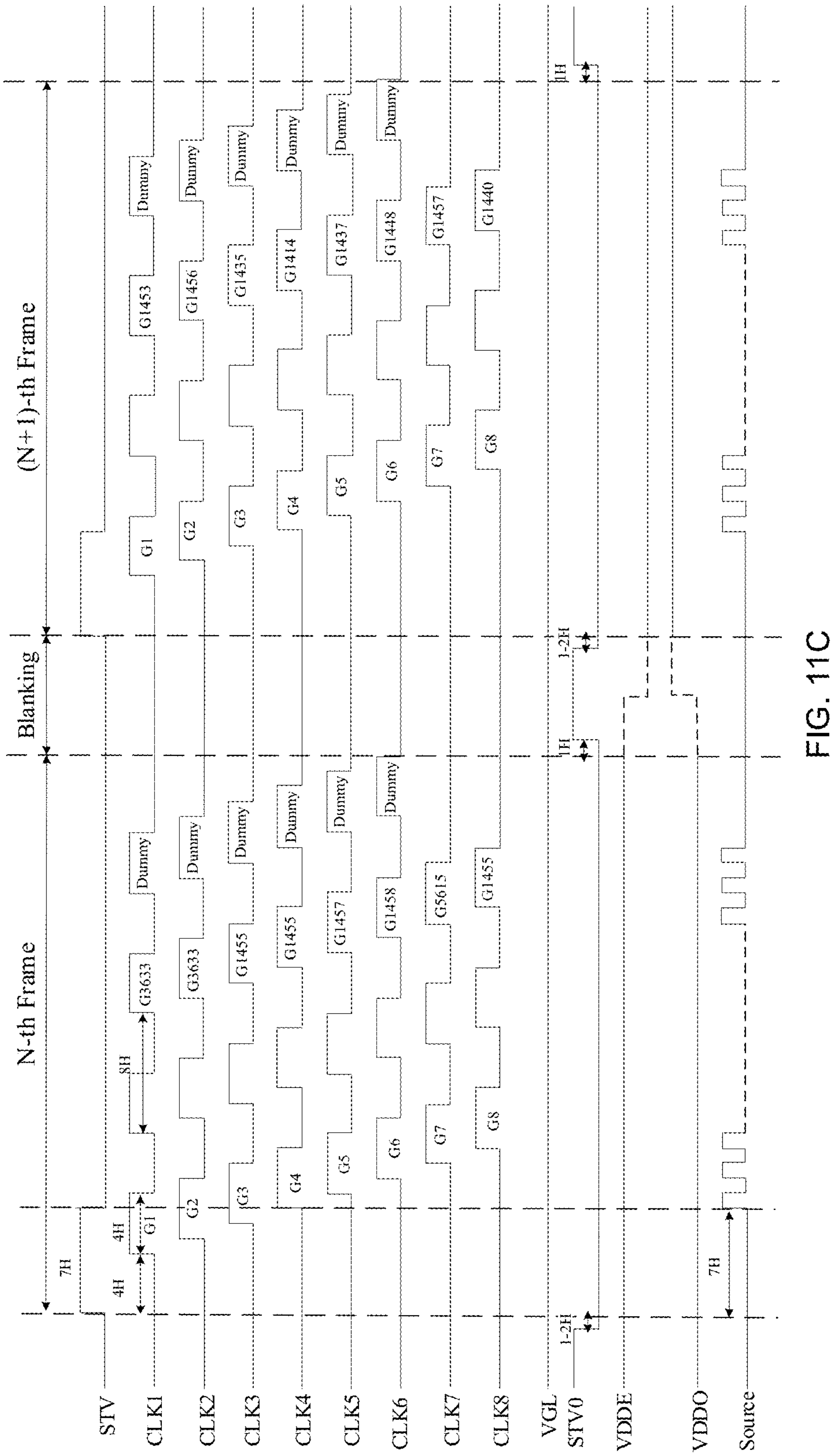
FIG. 11C is a timing diagram of FIG. 11A in accordance with some embodiments.
Figure 11D:
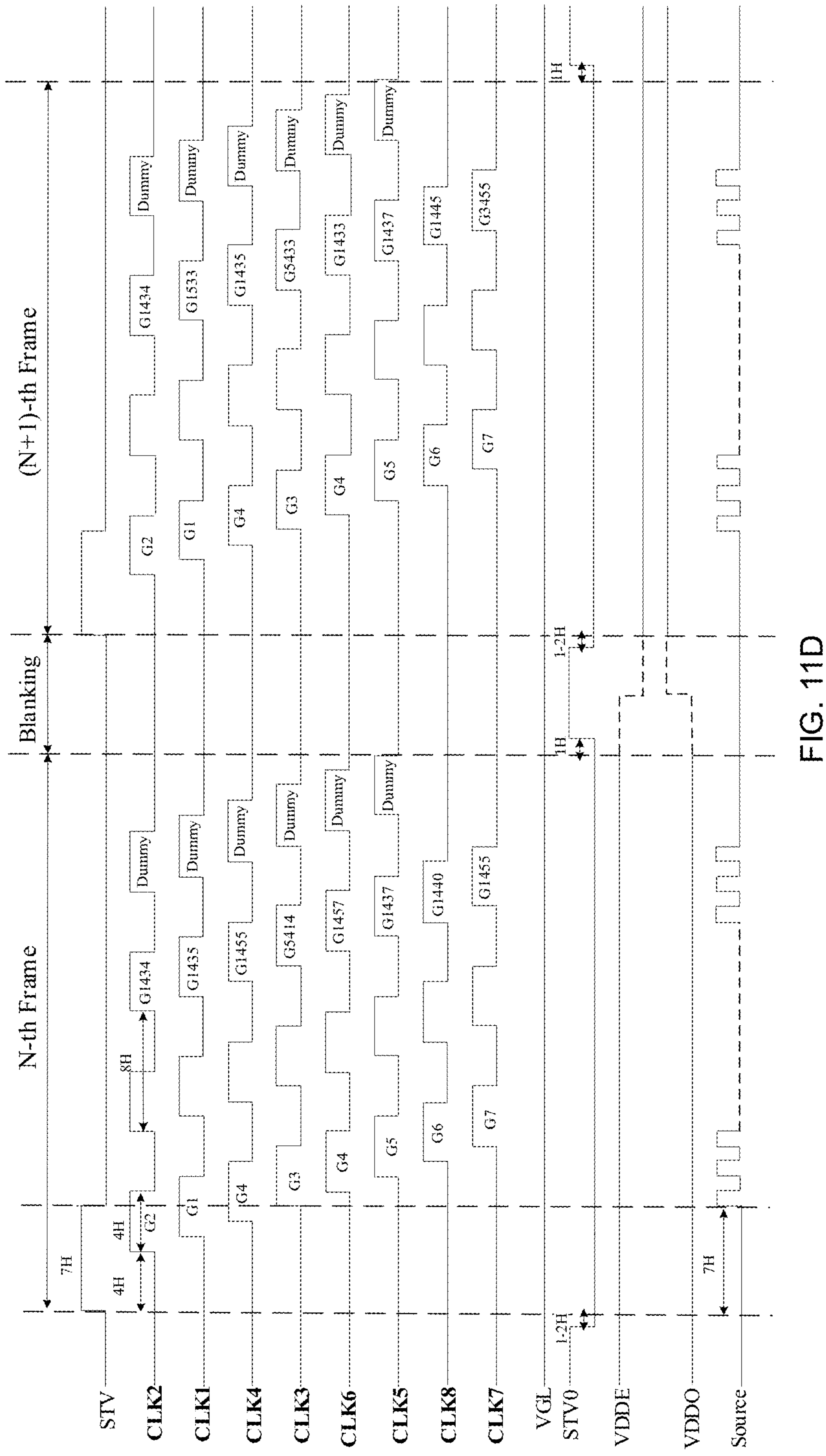
FIG. 11D is a timing diagram of FIG. 11A in accordance with some embodiments.
Figure 11E:
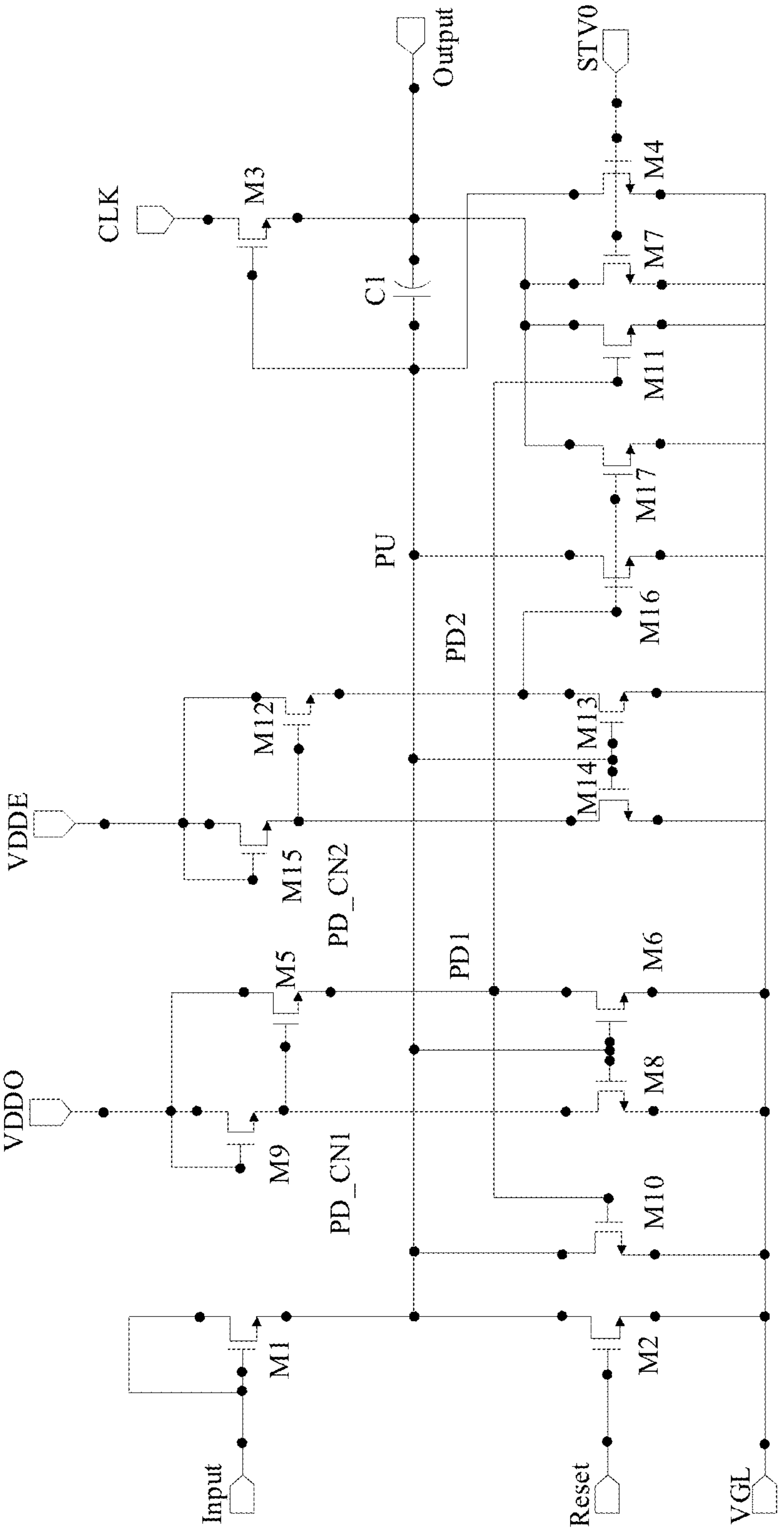
FIG. 11E is a circuit diagram of a shift register in accordance with some embodiments.

In some embodiments, as shown in FIG. 11E, the shift register includes a plurality of transistors, including an input transistor M1, a reset transistor M2, an output transistor M3, a storage capacitor C1, and a plurality of noise reduction transistors M. The plurality of noise reduction transistors M include a fourth transistor M4, a fifth transistor M5, a sixth transistor M6, a seventh transistor M7, an eighth transistor M8, a ninth transistor M9, a tenth transistor M10, an eleventh transistor M11, a twelfth transistor M12, a thirteenth transistor M13, a fourteenth transistor M14, a fifteenth transistor M15, a sixteenth transistor M16, and a seventeenth transistor M17. Here, a gate electrode and a first electrode of the input transistor M1 are both electrically connected to an input terminal Input, and a second electrode of the input transistor M1 is electrically connected to a pull-up node PU; a gate electrode of the reset transistor M2 is electrically connected to a reset terminal Reset, a first electrode of the reset transistor M2 is electrically connected to the pull-up node PU, and a second electrode of the reset transistor M2 is electrically connected to a first voltage signal line VGL; a gate electrode of the output transistor M3 is electrically connected to the pull-up node PU, a first electrode of the output transistor M3 is electrically connected to a clock signal line CLK, and a second electrode of the output transistor M3 is electrically connected to an output terminal Output; and the storage capacitor C1 is electrically connected between the pull-up node PU and the output terminal Output.

In the plurality of noise reduction transistors M, the fourth transistor M4, the sixth transistor M6, the seventh transistor M7, the eighth transistor M8, the tenth transistor M10, the eleventh transistor M11, the thirteenth transistor M13, and the fourteenth transistor M14 the sixteenth transistor M16, and the seventeenth transistor M17 are all electrically connected to the first voltage signal line VGL. The fifth transistor M5, the sixth transistor M6, the eighth transistor M8, and the ninth transistor M9 form a first pull-down node control sub-circuit PD_CN1, where the first pull-down node control sub-circuit PD_CN1 is electrically connected to a second voltage signal line VDDO and a first pull-down node PD1. The first pull-down node PD1 controls the gate electrode of the tenth transistor M10 and the gate electrode of the eleventh transistor M11, for reducing noise on the pull-up node and the output terminal. The twelfth transistor M12, the thirteenth transistor M13, the fourteenth transistor M14, and the fifteenth transistor M15 form a second pull-down node control sub-circuit PD_CN2, where the second pull-down node control sub-circuit PD_CN2 is electrically connected to a third voltage signal line VDDE and a second pull-down node PD2. The second pull-down node PD2 controls the gate electrode of the sixteenth transistor M16 and the gate electrode of the seventeenth transistor M17, for reducing noise on the pull-up node and the output terminal. The level of a signal transmitted by each of the second voltage signal line VDDO and the third voltage signal line VDDE is greater than the level of a signal transmitted by the first voltage signal line VGL. The first pull-down node control sub-circuit PD_CN1 and the second pull-down node control sub-circuit PD_CN2 may operate alternately to improve the service life of the shift register. An initialization signal bus STV0 controls the gate electrode of the seventh transistor M7 and the gate electrode of the fourth transistor M4, which is used to perform a total reset of the pull-up nodes and output terminals of all shift registers in the gate driving circuit before the start of a frame, and optionally, each shift register at each stage is connected to the initialization signal bus STV0 signal. The connection relationship of individual transistors in the present disclosure is referenced in FIG. 11E. For example, the gate electrode and the first electrode of the input transistor M1 are electrically connected together (optionally, the gate electrode and the first electrode of the input transistor M1 may also be supplied with signals respectively, which is not limited here), the second electrode of the input transistor M1 is electrically connected to the pull-up node PU; and the gate electrode of the output transistor M3 is electrically connected to the pull-up node, the first electrode of the output transistor M3 is electrically connected to the clock signal line CLK, and the second electrode of the output transistor M3 is electrically connected to the output terminal Output. The details of the connection mode of other transistors are shown in FIG. 11E, which will not be described again here.

In a case where a voltage at the pull-up node PU is a turn-on voltage, the output transistor M3 is turned on to transmit a valid clock signal from the clock signal line to the output terminal Output. This valid clock signal, serving as a gate scanning signal, is output from the output terminal Output to a gate line connected thereto, and the gate scanning signal is transmitted to sub-pixels connected there to the gate line therethrough, so as to control transistors in the sub-pixels to be turned on. Moreover, the valid clock signal is output as a cascade output signal to an input terminal or reset terminal of a shift register cascaded with the current shift register. In this way, the cascade output signal is transmitted to the input terminal of the shift register to control an input transistor M1 therein to be turned on, implementing the charging of a pull-up node PU therein, or the cascade output signal is transmitted to the reset terminal of the shift register to control a reset transistor M2 therein to be turned on, implementing the resetting of the pull-up node PU. Here, the valid clock signal is a signal capable of enabling a transistor controlled thereby to be turned on. For example, in a case where a transistor in a sub-pixel, or the input transistor M1 and the reset transistor M2 are N-type transistors, the level of the valid clock signal is a high level; while in a case where a transistor in a sub-pixel, or the input transistor M1 and the reset transistor M2 are P-type transistors, the level of the valid clock signal is a low level.

In some embodiments, referring to FIG. 11A, the display panel 100 further includes M clock signal lines CLK disposed on a side of the gate driving circuit 20 away from the display area, the clock signal lines CLK being electrically connected to the gate driving circuit 20. An i-th clock signal line is connected to a shift register at a (Mm+i)-th stage, where $1 \le i \le M$, and i is an integer, $0 \le m$, and m is an integer; and $(Mm+i) \le N$.

For example, referring to FIG. 11B, there are eight clock signal lines CLK shown in FIG. 11B, which are a first clock signal line CLK1 to an eighth clock signal line CLK8. That is, M is equal to 8. When m=0, and i is taken a value from 1 to 8 (i=1 to 8), the first clock signal line CLK1 is connected to a shift register at the first stage, the second clock signal line CLK2 is connected to a shift register at the second stage, . . . the eighth clock signal line CLK8 is connected to a shift register at the eighth stage. When m=1, and i is taken a value from 1 to 8 (i=1 to 8), the first clock signal line CLK1 is connected to a shift register at the ninth stage, and so on. A plurality of shift registers are divided into groups in units of eight adjacent ones, and each shift register in each group is connected to a respective clock signal line in turn.

In some examples, a signal transmission mode of the clock signal lines CLK is that: a starting position of a valid clock signal transmitted by an i-th clock signal line is earlier than a starting position of a valid clock signal transmitted by a (i+1)-th clock signal line, where $i+1 \le M$. Taking the valid clock signal being a high level as an example, a position of a rising edge of the valid clock signal transmitted by the i-th clock signal line is earlier than a position of a rising edge of the valid clock signal transmitted by the (i+1)-th clock signal line. Here, if an effective level is a high level, the output transistor M3 is an N-type transistor; whereas if the effective level is a low level, the output transistor M3 is a P-type transistor. The present disclosure is described by way of example where the transistor is an N-type transistor.

Referring to FIG. 11C, a starting position of a valid clock signal transmitted by the first clock signal line CLK1 is earlier than a starting position of a valid clock signal transmitted by the second clock signal line CLK2, the starting position of the valid clock signal transmitted by the second clock signal line CLK2 is earlier than a starting position of a valid clock signal transmitted by the third clock signal line CLK3, and so on. The starting positions of the valid clock signals transmitted by the first clock signal line CLK1 to the eighth clock signal line CLK8 are delayed in sequence, and the valid clock signals transmitted by these eight clock signal lines are output in a first order, that is, CLK1→CLK2→CLK3→CLK4→CLK5→CLK6→CLK7→CLK8. In this way, a shift register at the first stage to a shift register at the N-th stage output gate scanning signals to gate lines connected thereto in sequence.

In some embodiments, another signal transmission mode of the clock signal lines CLK is that: starting from the first clock signal line, every two adjacent clock signal lines form a group; in each group of clock signal lines, a starting position of a valid clock signal transmitted by a 2nd clock signal line is earlier than a starting position of a valid clock signal transmitted by a 1st clock signal line; and a starting position of a valid clock signal transmitted by an i-th clock signal line is earlier than a starting position of a valid clock signal transmitted by a (i+2)-th clock signal line, where $i+2 \leq M$.

For example, referring to FIG. 11D, there are eight clock signal lines CLK shown in FIG. 11D. Starting from the first clock signal line, every two adjacent clock signal lines form a group, that is, the first clock signal line CLK1 and the second clock signal line CLK2 form a group, the third clock signal line CLK3 and the fourth clock signal line CLK4 form a group, the fifth clock signal line CLK5 and the sixth clock signal line CLK6 form a group, and the seventh clock signal line CLK7 and the eighth clock signal line CLK8 form a group. In each group of clock signal lines, a starting position of a valid clock signal transmitted by the 2nd clock signal line is earlier than a starting position of a valid clock signal transmitted by the 1st clock signal line. That is, the starting positions of the valid clock signals transmitted by the eighth clock signal line CLK8, the sixth clock signal line CLK6, the fourth clock signal line CLK4, and the second clock signal line CLK2 are earlier than the starting positions of the valid clock signals transmitted by the seventh clock signal line CLK7, the fifth clock signal line CLK5, the third clock signal line CLK3, and the first clock signal line CLK1, respectively. The valid clock signals transmitted by these eight clock signal lines are output in a second order, that is, CLK2→CLK1→CLK4→CLK3→CLK6→CLK5→CLK8→CLK7. In this way, a shift register at the first stage to a shift register at the N-th stage output gate scanning signals in the order that exhibits an odd-even alternation with respect to the output mode with the first order. That is, in shift registers at two adjacent stages, a shift register at a 2nd stage outputs a gate scanning signal earlier than a shift register at a 1st stage.

Figure 11F:
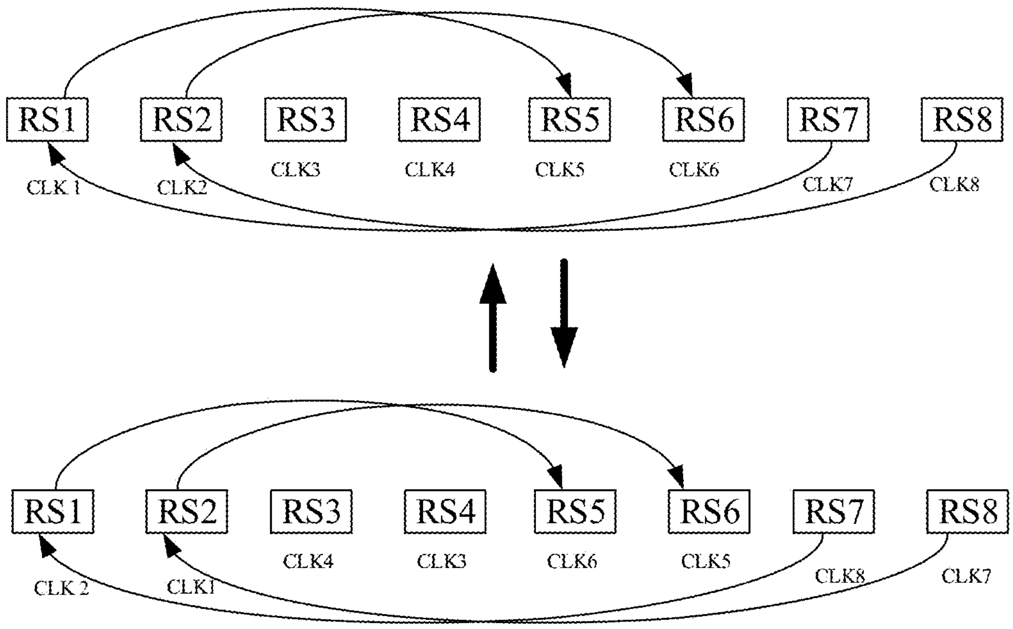
FIG. 11F is a diagram showing timing and reset relationship corresponding to a gate driving circuit in accordance with some embodiments.

In the gate driving circuit provided by the above embodiments of the present application, the cascade relationship of the shift registers is to use a delay of 2j rows for reset. The delay of even-numbered rows for reset can support the implementation of the odd-even alternation of timing signals, which is described in detail below. As shown in FIG. 11F, considering an example in which there are eight clock signal lines and eight shift registers, with a delay of two rows for reset, a cascade mode of the shift registers is that: the first shift register RS1 carries the fifth shift register RS5, the second shift register RS2 carries the sixth shift register RS6, the seventh shift register RS7 resets the first shift register RS1, and the eighth shift register RS8 resets the second shift register RS2. In the upper diagram of FIG. 11F, the valid clock signals of these eight clock signal lines are output in the first order, that is, CLK1→CLK2→CLK3→CLK4→CLK5→CLK6→CLK7→CLK8. Based on the cascade mode with the delay of even-numbered rows for reset, during carry, CLK1 corresponds to CLK5 and CLK2 corresponds to CLK6; and during reset, CLK7 corresponds to CLK1 and CLK8 corresponds to CLK2. In the lower diagram of FIG. 11F, the valid clock signals of these eight clock signal lines are output in the second order, that is, CLK2→CLK1→CLK4→CLK3→CLK6→CLK5→CLK8→CLK7. Based on the cascade mode with the delay of even-numbered rows for reset, during carry, CLK1 corresponds to CLK5 and CLK2 corresponds to CLK6; and during reset, CLK7 corresponds to CLK1 and CLK8 corresponds to CLK2. It can be seen that no matter which mode in which the valid clock signals of the clock signal lines are output is used, the corresponding relationship between the clock signal lines is consistent during the carry and reset of the shift registers, so the timing of the clock signal lines can be switched between the two modes. The carry and reset of each shift register of the gate driving circuit can be performed normally, and each shift register can output a gate scanning signal/cascade signal normally, and there will be no clock signal disorder leading to failure to failure of normal operation.

In some embodiments, based on the "dual-gate line+square wavy-shaped pixel architecture" shown in FIG. 1 and FIG. 2A, a same data line connects two columns of sub-pixels, that is, the same data signal drives two columns of sub-pixels, i.e., an odd column of sub-pixels and an even column of sub-pixels. As a result, if there is a pre-charging of sub-pixels, there is a difference in the charging process between an odd column of sub-pixels and an even column of sub-pixels, and vertical lines may occur when a charging rate of sub-pixels is insufficient. Especially for a blue color mixing image, it is more likely to have the risk of the vertical lines.

Figure 12A:
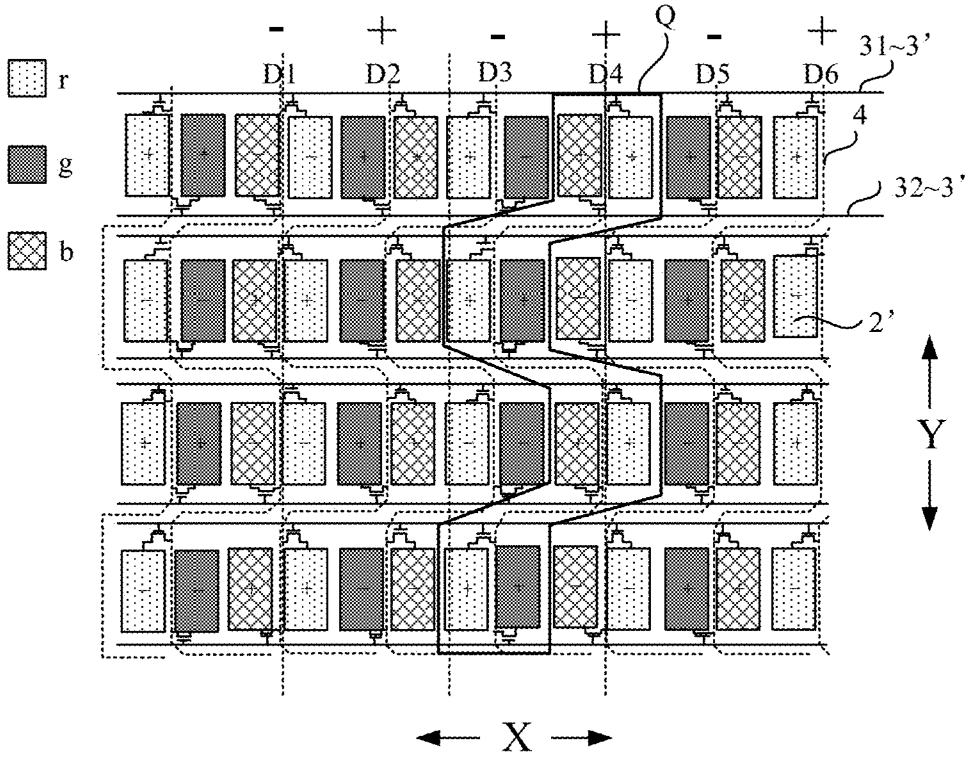
FIG. 12A is yet another structural diagram of an array substrate in accordance with some embodiments.

In some embodiments, refer to FIG. 12A, FIG. 12A is an arrangement diagram of a plurality of sub-pixels. The plurality of sub-pixels 2' include red sub-pixels r, green sub-pixels g, and blue sub-pixels b. For example, the plurality of sub-pixels are arranged in multiple columns along the row direction X, where a column of red sub-pixels r, a column of green sub-pixels g, and a column of blue sub-pixels b are arranged alternately. Sub-pixels arranged a line along the column direction Y have the same color. A gate line group 3 is electrically connected to a row of sub-pixels.

In a case where the above pixel architecture is applied to a sky blue image, a voltage on the data line for transmitting signals fluctuates due to the fact that a gray-scale voltage of the blue sub-pixel is relatively large and does not correspond to a gray-scale voltage of the red sub-pixel and a gray-scale voltage the green sub-pixel. This results in a phenomenon of an insufficient charging when data signals are transmitted to the red sub-pixel r passing by the blue sub-pixel b, to the green sub-pixel passing by the blue sub-pixel b, to the blue sub-pixel passing by the red sub-pixel, and to the blue sub-pixel passing by the green sub-pixel. Due to the insufficient charging, some of the red sub-pixels, green sub-pixels, and blue sub-pixels may display brightly or dimly. The human eyes are most sensitive to green sub-pixels, that is, a distribution of brightness and darkness of the green sub-pixels has the greatest impact on the visual effect, thus, the green sub-pixels displaying brightly in cycles ultimately lead to the problem of poor display of vertical lines.

Figure 12B:
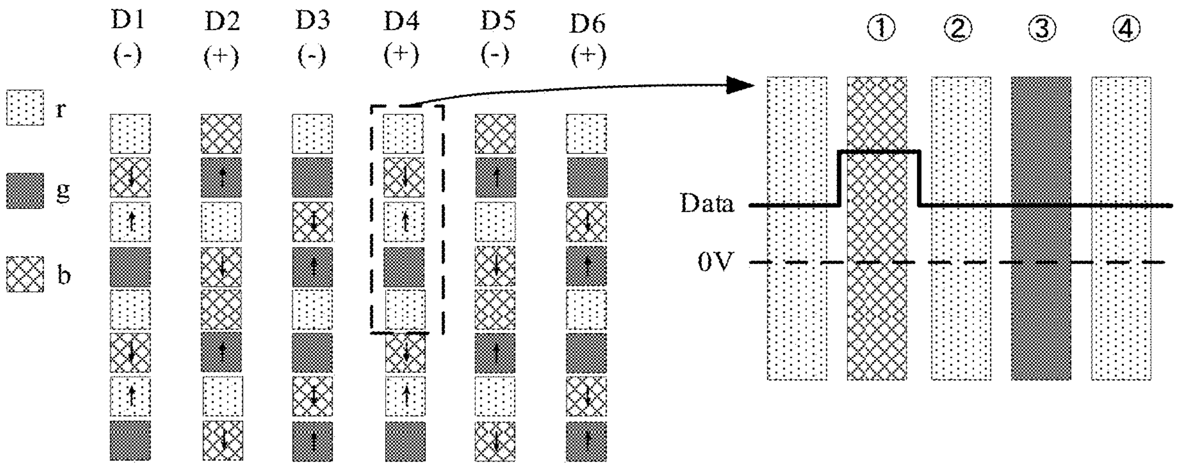
FIG. 12B is still another structural diagram of an array substrate in accordance with some embodiments.

FIG. 12B illustrates colors of sub-pixels written sequentially by each data line in FIG. 12A. Considering a data line D4 as an example, the data line D4 is electrically connected to sub-pixels circled by a box line Q, and an order in which the sub-pixels turn on the writing of data signals in sequence is: red, green, red, blue, red, green, red, and blue. As shown in FIG. 12B, for example, under a blue sky image, the gray-scale voltage of the blue sub-pixel is greater than both the gray-scale voltage of the red sub-pixel and the gray-scale voltage of the green sub-pixel, where the gray-scale voltage of the red sub-pixel and the gray-scale voltage of the green sub-pixel are consistent. When the gray-scale voltage changes abruptly, pixel undercharging is likely to occur, in which the voltage changes abruptly at the position ①, there is no pre-charging process at the position ② with a short charging time, and there is a pixel pre-charging process at the position ③ with a long charging time. In this way, a blue sub-pixel corresponding to the position ① is darker (with an abrupt change from a low gray-scale voltage to a high gray-scale voltage), a red sub-pixel corresponding to the position ② is brighter (with an abrupt change from a high gray-scale voltage to a low gray-scale voltage), and other sub-pixels have normal brightness. As a result, in the entire display area, sub-pixels at various positions will appear darker or brighter. The human eyes are most sensitive to green sub-pixels, that is, a distribution of brightness and darkness of the green sub-pixels has the greatest impact on the visual effect, thus, the green sub-pixels displaying brightly in cycles ultimately lead to the problem of poor display of vertical lines.

It can be understood that in the above gate driving circuit, the input signal at the reset terminal of the shift register is delayed, and thus the timing signal can be supported to be output in the first order output method or the second order output method when the timing is controlled. As shown in FIG. 12A, the red sub-pixels and blue sub-pixels are connected to gate lines in odd-numbered rows, and the green sub-pixels and blue sub-pixels are connected to gate lines in even-numbered rows. After adjusting to the clock signals correspondingly generated by the clock signal lines as shown in FIG. 11D, it can be realized that in each group of clock signal lines, a starting position of a valid clock signal transmitted by the 2nd clock signal line is earlier than a starting position of a valid clock signal transmitted by the 1st clock signal line. That is, it is possible to realize that signals received by the green sub-pixels and the blue sub-pixels connected to the gate lines in the even-numbered rows precede signals received by the red sub-pixels and the blue sub-pixels connected to the gate lines in the odd-numbered rows, and thus to change the order of turning on the sub-pixels, and to alleviate the situation of the abrupt change of the gray-scale voltages of the sub-pixels turned on successively. In this way, darker or brighter display caused by the insufficient or sufficient charging of some of the sub-pixels is improved, so as to avoid the problem of undesirable vertical lines caused by the charging difference, and in particular, to solve the problem of the vertical lines on the display panel when displaying the sky blue image.

In some embodiments, a duty cycle of a valid clock signal of each clock signal line, i.e., a CLK duty (clock control signal duty cycle), is 50%, which can realize a charge sharing of the clock signal, thereby reducing the power consumption of the gate driving circuit. Referring to FIG. 11C and FIG. 11D, where FIG. 11C and FIG. 11D are timing diagrams corresponding to the gate driving circuit in FIG. 11A, a falling edge of a timing signal received by the first clock signal line shown in FIG. 11C and FIG. 11D and a rising edge of a timing signal received by the fifth clock signal line are at the same moment, and a falling edge of a timing signal received by the second clock signal line and a rising edge of a timing signal received by the sixth clock signal line are at the same moment. That is, the CLK duty can be set to 50% to achieve the charge sharing and reduce power consumption.

Figure 13:
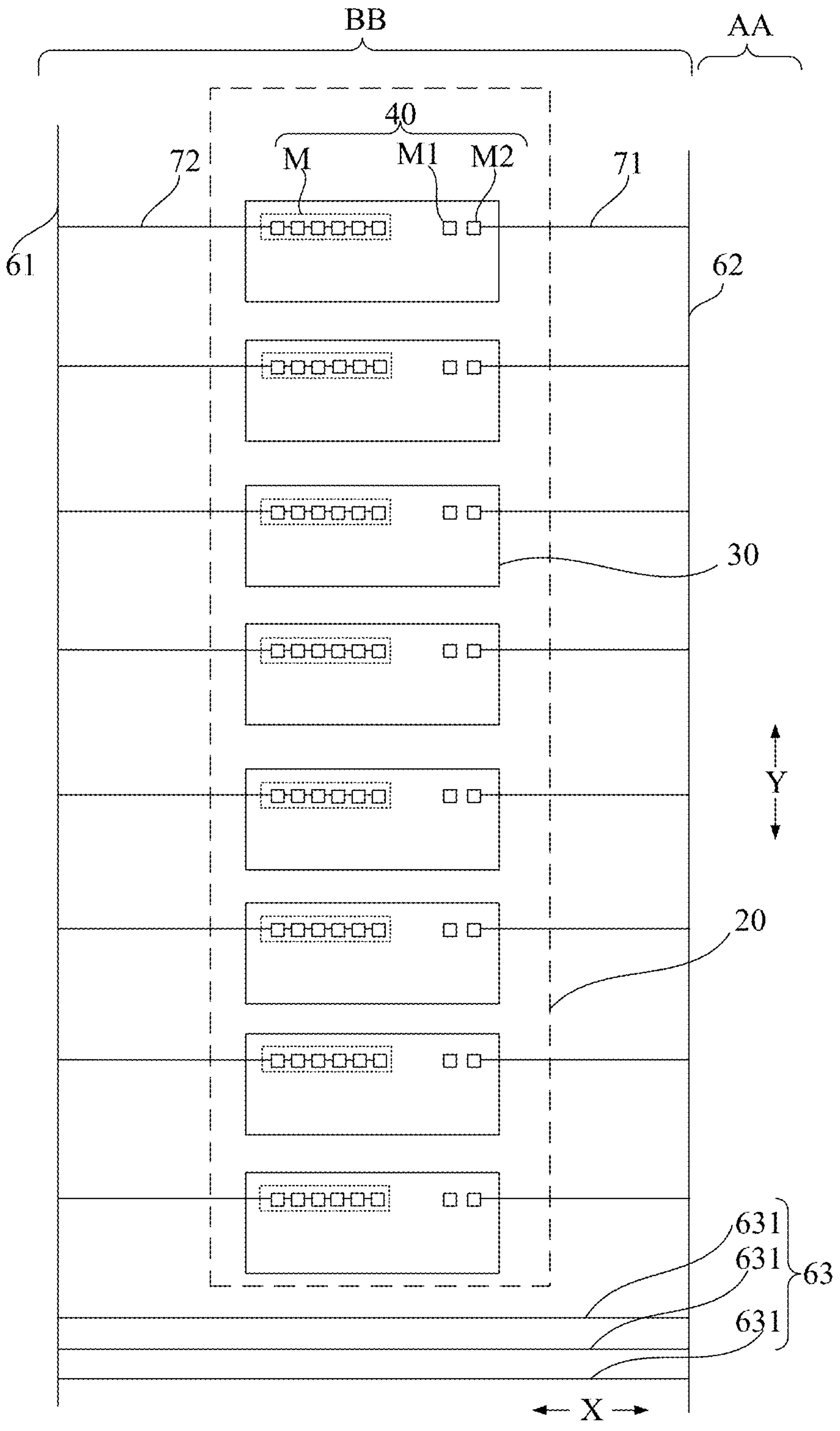
FIG. 13 is a structural diagram showing a connection of a gate driving circuit in accordance with some embodiments.

In some embodiments, referring to FIG. 13, the plurality of shift registers 30 are arranged along the column direction Y. and the display panel further includes: a first voltage signal line 61 (VGL). The shift register 30 at each stage includes a plurality of transistors 40, at least one of the plurality of transistors 40 being electrically connected to the voltage signal line 61. The transistors 40 include a plurality of reset transistors M2 and a plurality of noise reduction transistor M, and the shift registers 30 further include an input transistor M1. As shown in FIG. 11E, in the plurality of noise reduction transistors M, the fourth transistor M4, the sixth transistor M6, the seventh transistor M7, the eighth transistor M8, the tenth transistor M10, the eleventh transistor M11, the thirteenth transistor M13, the fourteenth transistor M14, the sixteenth transistor M16, and the seventeenth transistor M17 are all electrically connected to the first voltage signal line VGL, and the reset transistor M2 is electrically connected to the first voltage signal line 61, as described previously.

Figure 14A:
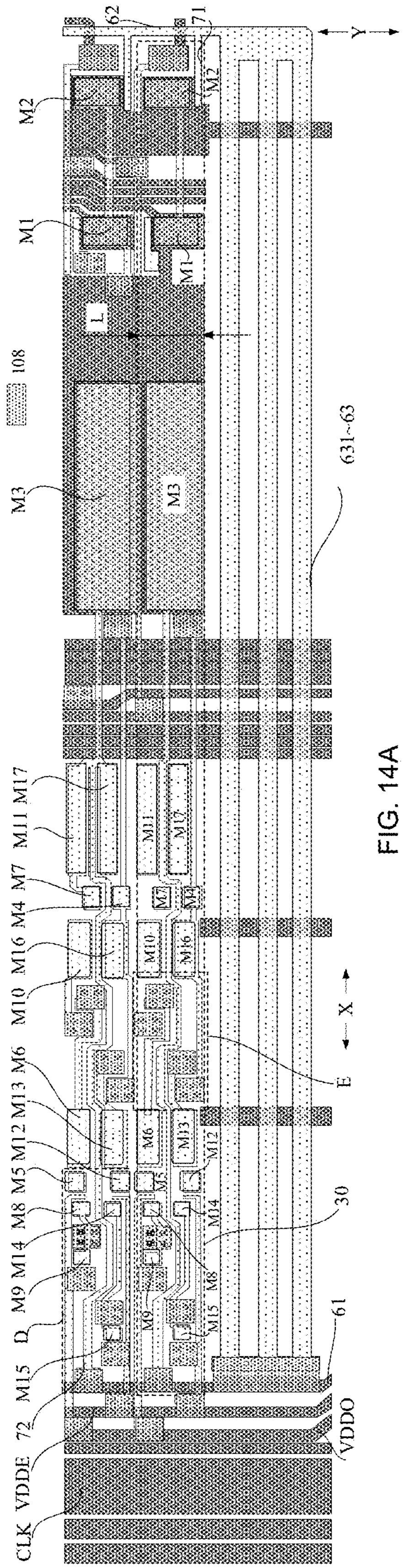
FIG. 14A a structural diagram showing a connection of a shift register in accordance with some embodiments.

As shown in FIG. 13 and FIG. 14A, the peripheral area of the display panel is further provided with a second voltage signal line VDDO and a third voltage signal line VDDE. The first voltage signal line 61 (VGL), the second voltage signal line VDDO and the third voltage signal line VDDE all extend along the column direction Y, and are all arranged on a side of the gate driving circuit 20 away from the display area AA.

The input transistor M1 and the reset transistor M2 are farther away from the first voltage signal line 61 (VGL) than the noise reduction transistors M, that is, the input transistor M1 and the reset transistor M2 are closer to the display area AA. The reset transistor M2 is connected to the reset terminal Reset, and the input transistor M1 is connected to the input terminal Input. A reset terminal Reset and an input terminal Input of a shift register at a certain stage are connected to output terminals Output of shift registers at other stages, while an output terminal Output of the shift register is connected to a gate line, and the output terminal Output of the shift register is arranged closer to the display area, so the input transistor M1 and the reset transistor M2 are arranged closer to the display area AA to make the connection. This causes the input transistor M1 and the reset transistor M2 to be farther away from the first voltage signal line 61, resulting in a problem in the connection of the reset transistor M2 to the first voltage signal line 61. If a lead, which has a relatively large length, is added to each shift register at each stage to connect the first voltage signal line 61 and the reset transistor M2, taking into account the spacing of each stage and the design of via holes and transistors, it will result in difficulty in the layout design of the shift register, occupy more space, indirectly increase the size of the peripheral area, and increase the bezel of the display panel.

In light of this, the display panel 100 further includes an auxiliary first voltage signal line 62 located on an opposite side of the gate driving circuit 20, and the first voltage signal line 61 is connected to the auxiliary first voltage signal line 20; and the input transistor M1 and the reset transistor M2 are closer to the auxiliary first voltage signal line 62 than the noise reduction transistors M. Reset transistors M2 of at least part of the shift registers 30 are each connected to the auxiliary first voltage signal line 62 through a first lead-out line 71.

For example, as shown in FIG. 13 and FIG. 14A, the first voltage signal line 61 and the auxiliary first voltage signal line 62 are respectively provided on both sides of the gate driving circuit 20 along the row direction X. The first voltage signal line 61 and the auxiliary first voltage signal line 62 both extend along the column direction Y, that is, the auxiliary first voltage signal line 62 is closer to the display area AA and is closer to the reset transistor M2. The reset transistor M2 and the auxiliary first voltage signal line 62 can be electrically connected together via the respective first lead-out line 71 of each of the at least part of the shift registers 30, and the first voltage signal line 61 is electrically connected to the auxiliary first voltage signal line 62 to realize an electrical connection between the reset transistor M2 and the first voltage signal line 61.

By arranging the auxiliary first voltage signal line 62, the first lead-out line 71 is used to connect the reset transistor M2 and the auxiliary first voltage signal line 62. Since the auxiliary first voltage signal line 62 is closer to the reset transistor M2, compared to leading a wire from the first voltage signal line 61 to connect to the reset transistor M2, the length of the first lead-out line 71 is shortened, the connection difficulty is reduced, the connection reliability is improved, the spatial layout of the gate driving circuit is optimized, the narrow bezel of the display panel is realized, and the efficiency of the signal transmission is improved.

In some embodiments, the display panel further includes a connection voltage signal line 63 disposed on a side of a shift register at the last stage of the gate driving circuit 20 away from the remaining shift registers 30, the first voltage signal line 61 and the auxiliary first voltage signal line 62 are connected through the connection voltage signal line 63. The connection voltage signal line 63 extends along the row direction X, and the connection voltage signal line 63 includes a plurality of signal sub-lines 631 electrically connected to each other.

For example, continuing to refer to FIG. 13 and FIG. 14A, the connection voltage signal line 63 extends along the row direction X, and includes the plurality of signal sub-lines 631 electrically connected to each other. Here, the signal sub-lines 631 are connected in parallel with each other, which can reduce the resistance of the connection voltage signal line 63 to reduce the signal transmission loss. By providing the connection voltage signal line 63, it is possible to reduce the transmission of ultraviolet light and the occurrence of electrostatic breakdown phenomenon.

In some embodiments, the noise reduction transistors of the shift registers 30 are connected to the voltage signal line 61 through second lead-out lines 72.

Figure 14B:
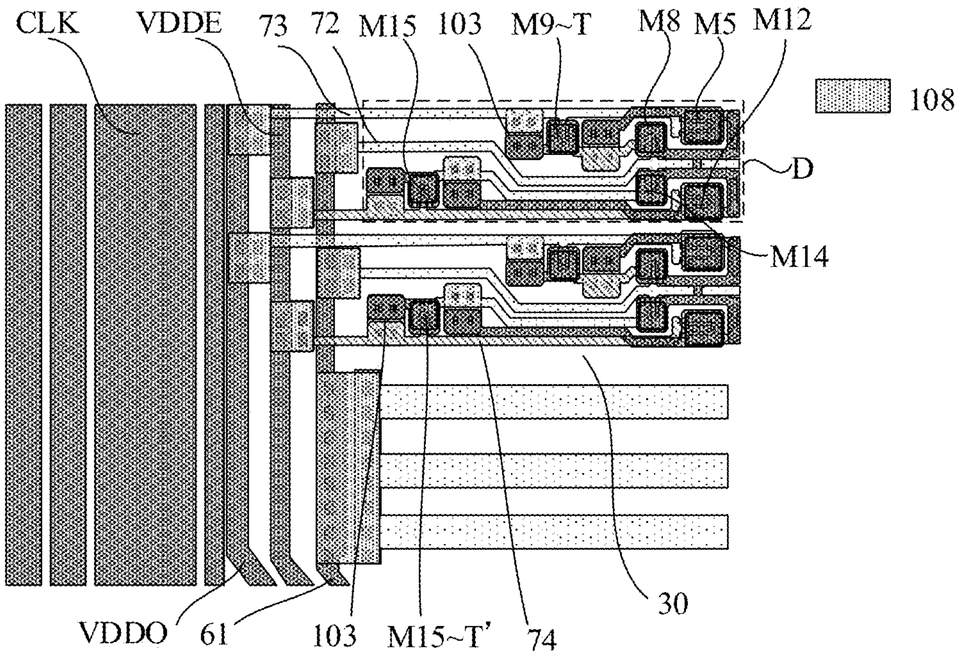
FIG. 14B is a partially enlarged view obtained based on FIG. 14A.

For example, referring to FIG. 13, FIG. 14A and FIG. 14B, the second lead-out lines 72 are electrically connected to the first voltage signal line 61. A second lead-out line 72 passes through the plurality of noise reduction transistors M, and the second lead-out line 72 is electrically connected to the fourth transistor M4, the sixth transistor M6, the seventh transistor M7, the eighth transistor M8, the tenth transistor M10, the eleventh transistor M11, the thirteenth transistor M13, the fourteenth transistor M14, the sixteenth transistor M16, and the seventeenth transistor M17 in the plurality of noise reduction transistors M, and the second lead-out line 72 is configured to transmit a first voltage signal for some of the transistors in the shift register 30 at the present stage.

The following describes the location of film layers of various signal lines located in the peripheral area.

Figure 14C:
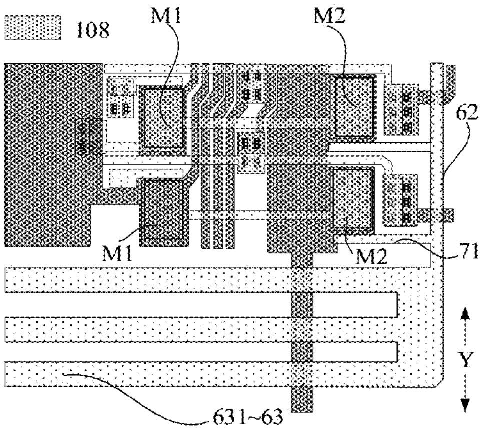
FIG. 14C is a partially enlarged view obtained based on FIG. 14A.

It will be noted that referring to FIG. 14A to FIG. 14C, optionally, the first voltage signal line 61 may be provided in a same layer and with a same material as the gate electrode of the transistor; the auxiliary first voltage signal line 62 and the second lead-out lines 72 are provided in a same layer and with a same material as the source-drain electrodes of the transistor; the second lead wire 72 is electrically connected to the first voltage signal line 61 through a via hole (where the via hole is filled with a transfer electrode, optionally the transfer electrode is in a same layer as the common electrode layer of the display area AA); and the plurality of transistors are electrically connected to other signal lines through via holes.

The connection voltage signal line 63 and the auxiliary first voltage signal line 62 are provided in a same layer and with a same material. Optionally, the two are provided in the same layer and with the same material as the source-drain electrodes of the transistor. One end of the connection voltage signal line 63 is electrically connected to the first voltage signal line 61 through a via hole (where the via hole is filled with a transfer electrode, optionally the transfer electrode is in the same layer as the common electrode layer of the display area AA) and the other end is electrically connected to the auxiliary first voltage signal line 62.

Optionally, the auxiliary first voltage signal line 62, the connection voltage signal line 63 and the first lead-out line 71 are in a one-piece structure in the same layer and of the same material, and are provided in the same layer and with the same material as the source-drain electrodes of the transistor. One electrode in source-drain electrodes of the reset transistor M2 is electrically connected to the first voltage signal line 61 through the first lead-out line 71.

For example, referring to FIG. 14A and FIG. 14B, in conjunction with FIG. 5, the first voltage signal line 61 is located in the gate layer 101; the auxiliary first voltage signal line 62, the connection voltage signal line 63, the first lead-out lines 71, and the second lead-out lines 72 are located in the source-drain metal 105; and a transfer electrode layer 108 is stacked on the source-drain metal layer. For example, the transfer electrode layer 108 and the common electrode layer 107 are in a same layer and of a same material, and the transfer electrode layer 108 includes a plurality of transfer electrodes. Via holes are provided between the transfer electrodes and both the gate layer and the source-drain metal layer. The transfer electrodes are used to electrically connect a signal line located in the gate layer 101 to signal lines located in the source-drain metal layer 105. The first voltage signal line 61 is connected to the second lead-out lines 72 through transfer electrodes corresponding thereto, and the first voltage signal line 61 is connected to the connection voltage signal line 63 a transfer electrode corresponding thereto.

In some examples, the second voltage signal line VDDO and the third voltage signal line VDDE are provided in a same layer and with a same material as the gate electrode of the transistor, that is, the second voltage signal line VDDO and the third voltage signal line VDDE are located in the gate layer 101. The second voltage signal line VDDO is connected to lead-out lines in the shift register through transfer electrodes corresponding thereto, and the third voltage signal line VDDE is connected to lead-out lines in the shift register through transfer electrodes corresponding thereto.

In some embodiments, the plurality of noise reduction transistors M includes a plurality of groups of transistors, each group of transistors including two transistors. The two transistors of each group of transistors are provided with a second lead-out line 72 therebetween, and the two transistors are disposed in a staggered manner in the column direction.

Figure 15A:
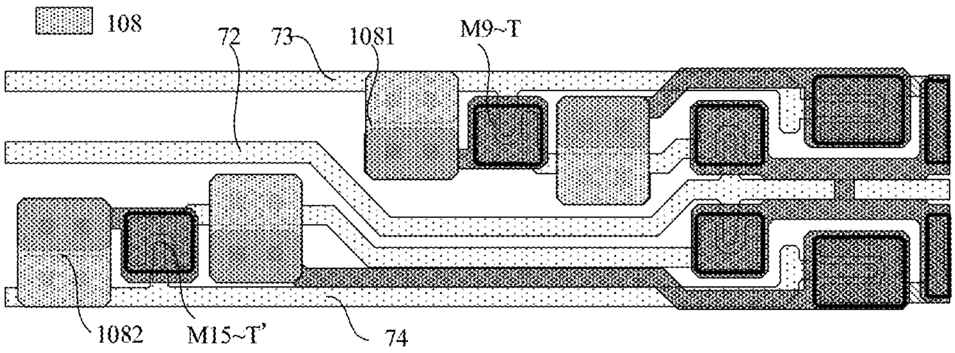
FIG. 15A is a partially enlarged view of the region D in FIG. 14A.

For example, referring to FIG. 15A, two transistors included in one group are T and T', e.g., the ninth transistor M9 and the fifteenth transistor M15, and the two transistors are disposed in a staggered manner in the column direction Y. In conjunction with FIG. 11E and FIG. 14B, the gate electrode of the ninth transistor M9 is electrically connected to a third lead-out line 73, one electrode of the source-drain electrodes of the ninth transistor M9 is connected to the third lead-out line 73 through a first transfer electrode 1081 and a corresponding via hole, and the third lead-out line 73 is electrically connected to the second voltage signal line VDDO through a transfer electrode and a corresponding via hole; and the gate electrode of the fifteenth transistor M15 is electrically connected to a fourth lead-out line 74, one electrode of the source-drain electrodes of the fifteenth transistor M14 is connected to the fourth lead-out line 74 through a first transfer electrode 1082 and a corresponding via hole, and the fourth lead-out line 74 is electrically connected to the third voltage signal line VDDE through a transfer electrode and a corresponding via hole. It can be seen that the ninth transistor M9 and the fifteenth transistor M15 are located on both sides of the second lead-out line 72 and are disposed in a staggered manner in the column direction Y. That is, the two transistors are not arranged in a straight line in the column direction, and the first transfer electrode 1081 and via hole corresponding to the ninth transistor M9 are also respectively disposed in a staggered manner with the first transfer electrode 1082 and via hole corresponding to the fifteenth transistor M15 in the column direction. Correspondingly, the second lead-out line 72 has a shape of a certain bend along the row direction X to match the spatial position of the transistors disposed on both sides thereof.

Figure 15B:
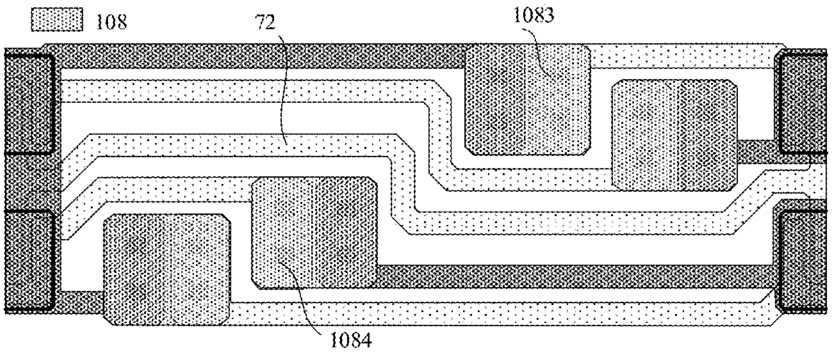
FIG. 15B is a partially enlarged view of the region E in FIG. 14A.

For example, referring to FIG. 15B, there are a third transfer electrode 1083 and a fourth transfer electrode 1084, which are located on both sides of the second lead-out line, and the third transfer electrode 1083 and the fourth transfer electrode 1084 are disposed in a staggered manner in the column direction.

The above-described setting method of arranging both a group of transistors and a group of transfer electrodes in the column direction in a staggered manner is capable of compressing space in the column direction Y, reducing the width of a shift register at each stage (i.e., a dimension of a region where the shift register 30 at each stage is located in the column direction), and is favorable for the arrangement of the shift registers in high-resolution products, and is also capable of increasing the life span of the gate driving circuit.

In some embodiments, as shown in FIG. 14A, a dimension L of a region where a shift register 30 at each stage is located in the column direction is in a range of 60 μm to 100 μm.

For example, the dimension L of the region where the shift register 30 at each stage is located in the column direction is 60 μm, 80 μm, or 100 μm.

As shown in FIG. 2A and FIG. 10, some embodiments of the present disclosure provide a driving method for a display panel, the display panel being the display panel provided by any of the above embodiments. The plurality of pixel groups 2 include multiple rows of pixel groups arranged along the column direction Y, and each row of pixel groups includes at least two pixel groups 2 arranged along the row direction; each row of pixel groups is disposed between a first gate line 31 and a second gate line 32 of a gate line group 3 and is electrically connected to the gate line group 3. The driving method includes: in a case where the display panel 100 is to display a first set image, outputting, by the gate driving circuit 20, a first set of gate driving signals, to activate the multiple rows of pixel groups 2 row by row under scanning of the plurality of gate line groups 3, where in each row of pixel groups, first sub-pixels electrically connected to the first gate line 31 are turned on before second sub-pixels electrically connected to the second gate line 32.

For example, the above-mentioned first set image is an image other than sky blue, which may be a pink image, a yellow image or other uncommon image, or an ordinary image. In this case, a difference between gray-scale voltages of all sub-pixels is small and does not cause fluctuations in the voltage transmission signal, which in turn ensures that a difference in brightness and darkness between the sub-pixels is not obvious and the display panel can display images normally. The first set of gate driving signals output by the gate driving circuit 20 can drive each row of pixel groups to be turned on row by row. Moreover, the first sub-pixels electrically connected to the first gate line 31 are turned on before the second sub-pixels electrically connected to the second gate line 32. Referring to FIG. 12A, the first sub-pixels in FIG. 12A are blue sub-pixels and red sub-pixels, and the second sub-pixels are blue sub-pixels and green sub-pixels, where under the control of the first set of gate driving signals, the first sub-pixels are turned on before the second sub-pixels.

In some embodiments, referring to FIG. 10, in a case where the display panel 100 is to display a second set image, the gate driving circuit 20 outputs a second set of gate driving signals, to activate the multiple rows of pixel groups row by row under scanning of the plurality of gate line groups 3, where in each row of pixel groups, the second sub-pixels electrically connected to the second gate line are turned on before the first sub-pixels electrically connected to the first gate line.

For example, the above-mentioned second set image is a sky blue image. In this case, the difference between gray-scale voltages of all sub-pixels is large and will cause fluctuations in the voltage transmission signal, so that the difference in brightness and darkness between the sub-pixels is obvious, and it is easy to have poor vertical lines to cause the display panel to be unable to display the image normally. The second set of gate driving signals output by the gate driving circuit 20 can drive each row of pixel groups to be turned on row by row. Moreover, the second sub-pixels electrically connected to the second gate line 32 are turned on before the first sub-pixels electrically connected to the first gate line 31. In this way, changing an order of driving the sub-pixels, i.e., an order of turning on, can improve the phenomenon of an insufficient charging between the sub-pixels, and thus reduce the difference in voltage, and alleviate the problem of the displayed image appearing the poor vertical lines. Referring to FIG. 12A, the first sub-pixels in FIG. 12A are blue sub-pixels and red sub-pixels, and the second sub-pixels are blue sub-pixels and green sub-pixels, where under the control of the second set of gate driving signals, the second sub-pixels are turned on before the first sub-pixels, that is, the second sub-pixels electrically connected to gate lines in the even-numbered rows are turned before the first sub-pixels electrically connected to gate lines in the odd-numbered rows.

Figure 16:
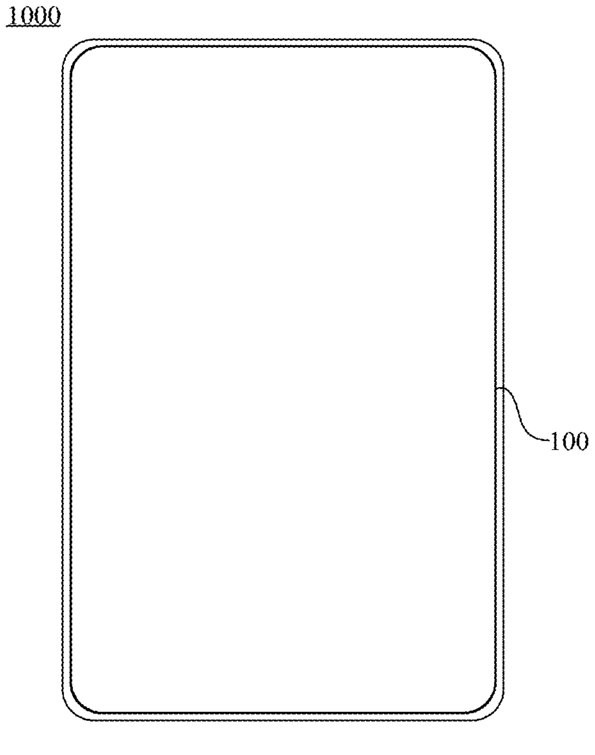
FIG. 16 is a structural diagram of a display apparatus in accordance with some embodiments.

As shown in FIG. 16, some embodiments of the disclosure provide a display apparatus 1000 including the display panel 100 provided by any of the above embodiments.

For example, the display apparatus 1000 may be a Mini LED (mini light-emitting diode) display apparatus, or the display apparatus 1000 may be a Micro LED (micro light-emitting diode) display apparatus.

In some examples, compared to the traditional LED, the mini light-emitting diode or micro light-emitting diode as a light-emitting device occupies a smaller volume and has smaller particles, so that the density of a light source per unit area is higher and the size of the unit of the light source is smaller within the same screen size, and thus a more precise localized control can be realized for the light-emitting device, which can ensure the uniformity of the display brightness, and thus ensure the display quality of the display apparatus 1000.

The display apparatus 1000 provided in some embodiments of the present disclosure may be any apparatus that can display images whether in motion (e.g., videos) or stationary (e.g., still images) and whether text or images. More specifically, it is expected that the embodiments may be implemented in or associated with a plurality of electronic apparatuses. The plurality of electronic apparatuses may include (but is not limited to), for example, mobile telephones, wireless devices, personal data assistants (PDA), hand-held or portable computers, GPS receivers/navigators, cameras, MP4 video players, video cameras, game consoles, watches, clocks, calculators, TV monitors, flat panel displays, computer monitors, car displays (such as odometer displays, etc.), navigators, cockpit controllers and/or displays, camera view displays (such as rear view camera displays in vehicles), electronic photos, electronic billboards or indicators, projectors, building structures, packaging and aesthetic structures (such as a display for an image of a piece of jewelry), etc.

The embodiments of the present disclosure do not place special restrictions on the specific form of the above-mentioned display apparatus. The display apparatus 1000 adopts the display panel 100 provided by the above-mentioned embodiments. Therefore, the display apparatus 1000 provided by the present disclosure has all beneficial effects of the display panel 100 provided by any of the above embodiments, which will not be described in detail here.

For example, as shown in FIG. 16, the display apparatus 1000 has a planar shape of a rectangle.

Figure 17:
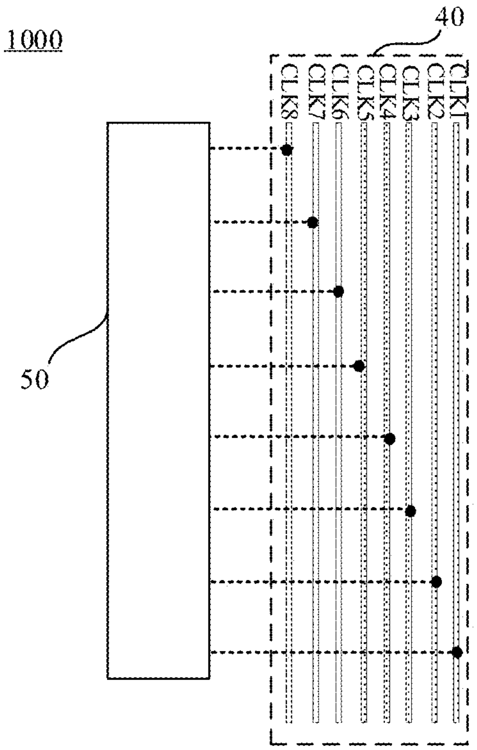
FIG. 17 is a structural diagram showing a connection of a control chip in accordance with some embodiments.

In some embodiments, referring to FIG. 17 and FIG. 11A, the display apparatus 1000 further includes M clock signal lines, in which an i-th clock signal line is connected to a shift register at a (Mm+i)-th stage, where $1 \le i \le M$, i is a positive integer, $0 \le m$, m is a positive integer, and $(Mm+i) \le N$. The display apparatus 1000 further includes a control chip 50, and the control chip 50 is connected to the M clock signal lines, to output clock signals to the M clock signal lines. The control chip 50 is configured to, when detecting that the display panel is to display the first set image, sequentially output valid clock signals to the M clock signal lines in a first order, where the first order is 1, 2, 3, 4, . . . , M−1, and M, and when detecting that the display panel is to display the second set image, sequentially output valid clock signals to the M clock signal lines in a second order, where the second order is 2, 1, 4, 3, . . . , M, and M−1.

For example, there are eight clock signal lines shown in FIG. 17, that is, M is equal to eight. In a case where m is equal to 0, the first clock signal line is connected to a shift register at the first-stage. The display apparatus 1000 includes a control chip 50, and the control chip 50 is connected to the eight clock signal lines, to output clock signals to the eight clock signal lines. The control chip 50, when detecting that the display panel is to display the first set image, sequentially outputs valid clock signals to the eight clock signal lines in the first order, where the first order is 1, 2, 3, 4, 5, 6, 7, and 8, and when detecting that the display panel is to display the second set image, sequentially outputs valid clock signals to the eight clock signal lines in the second order, where the second order is 2, 1, 4, 3, 6, 5, 8, and 7. The above shown in FIG. 17 is only one example, and an order in which clock signals output by other numbers of clock signal lines under a corresponding set image can be calculated by referring to the above formula, which will not be described herein.

The foregoing description is only specific embodiments of the present disclosure, but the scope of protection of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

The invention claimed is:

1. An array substrate, comprising:

a base substrate;

a plurality of sub-pixels arranged in an array and disposed on the base substrate, the plurality of sub-pixels being arranged in E rows and F columns, wherein the plurality of sub-pixels form a plurality of pixel groups, each pixel group includes a first sub-pixel and a second sub-pixel, the first sub-pixel includes a first transistor and a first electrode group, and the second sub-pixel includes a second transistor and a second electrode group; the first electrode group and the second electrode group are arranged sequentially along a row direction; the first transistor and the second transistor are both located between the first electrode group and the second electrode group, and are respectively located on both ends of the pixel group along a column direction; and the first electrode group includes a first pixel electrode and a first common electrode, and the second electrode group includes a second pixel electrode and a second common electrode;

a plurality of gate lines disposed on the base substrate, the plurality of gate lines forming a plurality of gate line groups, wherein each gate line group includes a first gate line and a second gate line, and the first sub-pixel and the second sub-pixel of each pixel group are respectively connected to a first gate line and a second gate line of one gate line group; and a plurality of data lines disposed on the base substrate, wherein the first sub-pixel and the second sub-pixel of each pixel group are connected to one of the data lines; at least part of the plurality of data lines each include third data segments extending along the row direction, first data segments and second data segments extending along the column direction, a third data segment being connected between a first data segment and a second data segment; and the first data segments are disposed between an i-th column of sub-pixels and a (i+1)-th column of sub-pixels, and the second data segments are disposed between a (i−j)-th column of sub-pixels and a (i−j−1)-th column of sub-pixels, and j is greater than or equal to 1; and $i+1 \le F$;

wherein an overlapping area of the first pixel electrode and the first common electrode is equal to an overlapping area of the second pixel electrode and the second common electrode.

2. The array substrate according to claim 1, wherein j=1; and two data lines located outermost in the row direction are a first data line and a second data line, wherein first data segments of the first data line are disposed between a first column of sub-pixels and a second column of sub-pixels, and second data segments of the first data line are disposed on a side of the first column of sub-pixels away from multiple columns of sub-pixels other than the first column of sub-pixels in the F columns; and first data segments of the second data line are disposed on a side of an F-th column of sub-pixels away from multiple columns of sub-pixels other than the F-th column of sub-pixels in the F columns, and second data segments of the second data line are disposed between a (F−1)-th column of sub-pixels and the F-th column of sub-pixels.

3. The array substrate according to claim 1, wherein at least a portion of the data line connected to the pixel group is located between the first electrode group and the second electrode group of the pixel group, and the at least a portion of the data line is a first data segment or a second data segment;

a first electrode of the first transistor and a first electrode of the second transistor are both connected to the data line, a second electrode of the first transistor is connected to the first pixel electrode, and a second electrode of the second transistor is connected to the second pixel electrode; and a direction that is from the first electrode to the second electrode of the first transistor and parallel to the row direction is a first direction, and a direction that is from the first electrode to the second electrode of the second transistor and parallel to the row direction is a second direction, the first direction being opposite to the second direction.

4. The array substrate according to claim 3, wherein the first transistor and the second transistor each include a gate electrode, an active layer, and source-drain electrodes that are stacked in sequence, and the source-drain electrodes include the first electrode and the second electrode; and an orthographic projection of the active layer on the base substrate lies within an orthographic projection of the gate electrode on the base substrate, and at least a portion of an orthographic projection of each of the first electrode and the second electrode on the base substrate lies within the orthographic projection of the active layer on the base substrate; and an orthographic projection of the first electrode is U-shaped, and an opening of the first electrode faces the second electrode.

5. The array substrate according to claim 1, wherein the first pixel electrode and the second pixel electrode are block electrodes, the first common electrode and the second common electrode are strip electrodes, and the first common electrode and the second common electrode each include a plurality of slits;

an aperture ratio of the first sub-pixel is equal to an aperture ratio of the second sub-pixel; and the first electrode group has a first domain region and a second domain region arranged along the column direction, and the second electrode group has a third domain region and a fourth domain region arranged along the column direction; and the first domain region, the second domain region, the third domain region, and the fourth domain region have a same aperture ratio.

6. The array substrate according to claim 1, further comprising: first spacers, a first spacer being disposed on a side of the first transistor away from the base substrate, and second spacers, a second spacer being disposed on a side of the second transistor away from the base substrate, wherein a center of an orthographic projection of the first spacer on the base substrate is offset a first distance in a third direction relative to a center of an orthographic projection of the first transistor on the base substrate, the third direction being a direction in which the first transistor points to the second transistor; and a center of an orthographic projection of the second spacer on the base substrate is offset a second distance in a fourth direction relative to a center of an orthographic projection of the second transistor on the base substrate, the fourth direction being a direction in which the second transistor points to the first transistor.

7. The array substrate according to claim 6, wherein the first distance is equal to the second distance.

8. The array substrate according to claim 7, wherein the orthographic projection of the first spacer on the base substrate has an overlap with the orthographic projections of the first pixel electrode and the second pixel electrode on the base substrate; and the orthographic projection of the second spacer on the base substrate has an overlap with the orthographic projections of the first pixel electrode and the second pixel electrode on the base substrate.

9. A display panel having a display area and a peripheral area, comprising:

the array substrate according to claim 1, wherein the plurality of pixel groups are located in the display area; and at least one gate driving circuit disposed on the base substrate and located in the peripheral area, wherein a gate driving circuit includes N shift registers cascaded;

wherein an output terminal of a shift register at an i-th stage is connected to an input terminal of a shift register at a (i+n)-th stage, and an output terminal of a shift register at a (i+n+2j)-th stage is connected to a reset terminal of the shift register at the i-th stage; and j is greater than or equal to 1;

the plurality of gate lines are arranged sequentially along the column direction, and a plurality of first gate lines in the plurality of gate lines and a plurality of second gate lines in the plurality of gate lines are alternately arranged; and in the N shift registers cascaded, a shift register is electrically connected to a gate line.

10. The display panel according to claim 9, wherein the N shift registers are arranged in the column direction; and the display panel further comprises: a first voltage signal line disposed on a side of the gate driving circuit along the row direction;

an auxiliary first voltage signal line located on an opposite side of the gate driving circuit; and first lead-out lines;

wherein a shift register at each stage includes a plurality of transistors, and at least one of the plurality of transistors is electrically connected to the first voltage signal line;

the plurality of transistors include a reset transistor, a plurality of noise reduction transistors and an input transistor, and the input transistor and the reset transistor are farther away from the first voltage signal line than the noise reduction transistors;

the first voltage signal line is connected to the auxiliary first voltage signal line; and the input transistor and the reset transistor are closer to the auxiliary first voltage signal line than the noise reduction transistors; and reset transistors of at least part of the N shift registers are each connected to the auxiliary first voltage signal line through a first lead-out line.

11. The display panel according to claim 10, further comprising: a connection voltage signal line disposed on a side of a shift register at a last stage of the gate driving circuit away from remaining shift registers, the first voltage signal line and the auxiliary first voltage signal line are connected through the connection voltage signal line, and the connection voltage signal line extends along the row direction;

wherein the connection voltage signal line includes a plurality of signal sub-lines electrically connected to each other.

12. The display panel according to claim 10, further comprising: second lead-out lines, wherein the noise reduction transistors of the shift register at each stage are connected to the first voltage signal line through a second lead-out line.

13. The display panel according to claim 12, wherein the plurality of noise reduction transistors form a plurality of groups of noise reduction transistors, each group of noise reduction transistors includes two noise reduction transistors, and the two noise reduction transistors of each group of noise reduction transistors are provided therebetween with a second lead-out line; and for at least one group of noise reduction transistors, two noise reduction transistors therein are disposed in a staggered manner in the column direction.

14. The display panel according to claim 9, wherein in the column direction, a dimension of a region where the shift register at each stage is located is in a range of 60 μm to 100 μm.

15. The display panel according to claim 9, further comprising:

M clock signal lines disposed on a side of the gate driving circuit away from the display area, the clock signal lines being electrically connected to the gate driving circuit, and an i-th clock signal line being connected to a shift register at a (Mm+i)-th stage, wherein 1≤i≤M, i is an integer, 0≤m, m is an integer, and (Mm+i)≤N.

16. The display panel according to claim 15, wherein a starting position of a valid clock signal output by the i-th clock signal line is earlier than a starting position of a valid clock signal of a (i+1)-th clock signal line, i+1≤M; or starting from a first clock signal line, every two adjacent clock signal lines form a group; in each group of clock signal lines, a starting position of a valid clock signal transmitted by a 2nd clock signal line is earlier than a starting position of a valid clock signal transmitted by a 1st clock signal line; and the starting position of the valid clock signal transmitted by the i-th clock signal line is earlier than a starting position of a valid clock signal transmitted by a (i+2)-th clock signal line, i+2≤M.

17. A driving method for a display panel, applied to the display panel according to claim 9, wherein the plurality of pixel groups include multiple rows of pixel groups arranged along the column direction, and each row of pixel groups includes at least two pixel groups arranged along the row direction; each row of pixel groups is disposed between a first gate line and a second gate line of a gate line group and is electrically connected to the gate line group; and the driving method comprises:

in a case where the display panel is to display a first set image, outputting, by the gate driving circuit, a first set of gate driving signals, to activate the multiple rows of pixel groups row by row under scanning of the plurality of gate line groups, wherein in each row of pixel groups, first sub-pixels electrically connected to the first gate line are turned on before second sub-pixels electrically connected to the second gate line.

18. The driving method for the display panel according to claim 17, further comprising:

in a case where the display panel is to display a second set image, outputting, by the gate driving circuit, a second set of gate driving signals, to activate the multiple rows of pixel groups row by row under scanning of the plurality of gate line groups, wherein in each row of pixel groups, the second sub-pixels electrically connected to the second gate line are turned on before the first sub-pixels electrically connected to the first gate line.

19. A display apparatus, comprising the display panel according to claim 9.

20. The display apparatus according to claim 19, further comprising:

M clock signal lines, an i-th clock signal line being connected to a shift register at a (Mm+i)-th stage, wherein 1≤i≤M, i is an integer, 0≤m, m is an integer, and (Mm+i)≤N; and a control chip, the control chip being connected to the M clock signal lines to output clock signals to the M clock signal lines;

wherein the control chip is configured to, when detecting that the display panel is to display a first set image, sequentially output valid clock signals to the M clock signal lines in a first order, wherein the first order is 1, 2, 3, 4, . . . , M−1, and M, and when detecting that the display panel is to display a second set image, sequentially output the valid clock signals to the M clock signal lines in a second order, wherein the second order is 2, 1, 4, 3, . . . , M, and M−1.

* * * * *